(12) United States Patent
Suo et al.

(10) Patent No.: US 11,322,061 B1
(45) Date of Patent: May 3, 2022

(54) ARRAY SUBSTRATE, DISPLAY PANEL, AND DETECTION METHOD

(71) Applicant: Xiamen Tianma Micro-Electronics Co., Ltd., Xiamen (CN)

(72) Inventors: Lei Suo, Shanghai (CN); Yana Gao, Shanghai (CN); Lilian Kuang, Shanghai (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 0 days.

(21) Appl. No.: 17/215,309

(22) Filed: Mar. 29, 2021

(30) Foreign Application Priority Data

Jan. 5, 2021 (CN) .......................... 202110009333.0

(51) Int. Cl.
*G09G 3/00* (2006.01)
*G09G 3/3233* (2016.01)
*G01R 31/67* (2020.01)

(52) U.S. Cl.
CPC ............ *G09G 3/006* (2013.01); *G01R 31/67* (2020.01); *G09G 3/3233* (2013.01); *G09G 2300/08* (2013.01); *G09G 2320/029* (2013.01); *G09G 2320/0233* (2013.01); *G09G 2320/045* (2013.01)

(58) Field of Classification Search
CPC .......... G09G 3/006; G09G 3/32–3291; G09G 2300/02; G09G 2300/0421–043; G09G 2300/08; G09G 2310/0243; G09G 2320/02; G09G 2320/0233; G09G 2320/0242; G09G 2320/029; G09G 2320/043–046; G09G 2320/0693; G09G 2320/08; G09G 2330/028; G09G 2330/04; G09G 2330/12; G01R 31/50; G01R 31/66; G01R 31/67
See application file for complete search history.

(56) References Cited

U.S. PATENT DOCUMENTS

| 5,548,301 A * | 8/1996 | Kornher | G09G 3/2022 345/205 |
| 2008/0077832 A1* | 3/2008 | Chen | G09G 3/006 714/724 |
| 2012/0162165 A1* | 6/2012 | Lee | G09G 3/006 345/206 |
| 2013/0099816 A1* | 4/2013 | Kawase | H01L 27/156 324/762.03 |
| 2017/0200404 A1* | 7/2017 | Han | G09G 3/3266 |
| 2021/0056191 A1* | 2/2021 | Emerson | G06T 1/0021 |

FOREIGN PATENT DOCUMENTS

CN 107103869 A 8/2017

\* cited by examiner

*Primary Examiner* — Nathan Danielsen
(74) *Attorney, Agent, or Firm* — Anova Law Group, PLLC

(57) ABSTRACT

An array substrate, a display panel and a detection method are provided. The array substrate includes a plurality of display pixels and at least one detection element. When an aging process is performed on the plurality of display pixels, a first driving signal is applied on the at least one detection element and the at least one detection element changes from a first state to a second state, wherein the second state is different from the first state. The second state of the at least one detection element indicates that the plurality of display pixels has undergone the aging process.

22 Claims, 31 Drawing Sheets

ARRAY SUBSTRATE, DISPLAY PANEL, AND DETECTION METHOD

CROSS-REFERENCES TO RELATED APPLICATION

This application claims the priority of Chinese Patent Application No. 202110009333.0, filed on Jan. 5, 2021, the content of which is incorporated herein by reference in its entirety.

TECHNICAL FIELD

The present disclosure generally relates to the field of display technology and, more particularly, relates to an array substrate, a display panel, and a detection method.

BACKGROUND

As display technologies develop, display panels have been applied more and more popularly, and have gradually become indispensable components of various electronic products. In practical applications, as using time of a display panel increases, the luminous efficiency of the display panel will decrease, that is, the brightness of the display panel will decrease under a same driving current. Especially for newly fabricated display panels, the luminous efficiency of the display panels changes greatly with the increase in using time. Therefore, when an existing display panel is manufactured, each display pixel in the display panel is pre-aged, such that the brightness of the display panel basically does not change during the process of displaying images after the display panel is manufactured.

However, in the manufacturing process of the existing display panel, it is inevitable that the aging process is missed, which affects the yield rate of the display panel. Therefore, how to determine whether the display panel has undergone an aging process during the manufacturing process of the display panel has become a technical problem to be solved urgently by those skilled in the art.

SUMMARY

One aspect of the present disclosure provides an array substrate. The array substrate includes a plurality of display pixels and at least one detection element. When an aging process is performed on the plurality of display pixels, a first driving signal is applied on the at least one detection element and the at least one detection element changes from a first state to a second state, wherein the second state is different from the first state. The second state of the at least one detection element indicates that the plurality of display pixels has undergone the aging process.

Another aspect of the present disclosure provides a display panel. The display panel includes an array substrate including a plurality of display pixels and at least one detection element, and a driving circuit. When an aging process is performed on the plurality of display pixels, a first driving signal is applied on the at least one detection element and the at least one detection element changes from a first state to a second state, wherein the second state is different from the first state. The second state of the at least one detection element indicates that the plurality of display pixels has undergone the aging process. The driving circuit is connected to a signal connection terminal of the array substrate for providing driving signals to the plurality of display pixels and the at least one detection element. When the driving circuit providing a driving signal to the at least one detection element, it is determined that the plurality of display pixels has undergone the aging process when the at least one detection element is in the second state, and it is determined the plurality of display pixels has not undergone the aging process when the at least one detection element is in the first state.

Another aspect of the present disclosure provides a detection method. The detection method can be applied to an array substrate including a plurality of display pixels and at least one detection element. When an aging process is performed on the plurality of display pixels, a first driving signal is applied on the at least one detection element and the at least one detection element changes from a first state to a second state, wherein the second state is different from the first state. The second state of the at least one detection element indicates that the plurality of display pixels has undergone the aging process. The method includes: providing a second driving signal to the at least one detection element; determining that the plurality of display pixels has not undergone the aging process when the at least one detection element is in the first state; and determining that the plurality of display pixels has undergone the aging process when the at least one detection element is in the second state.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
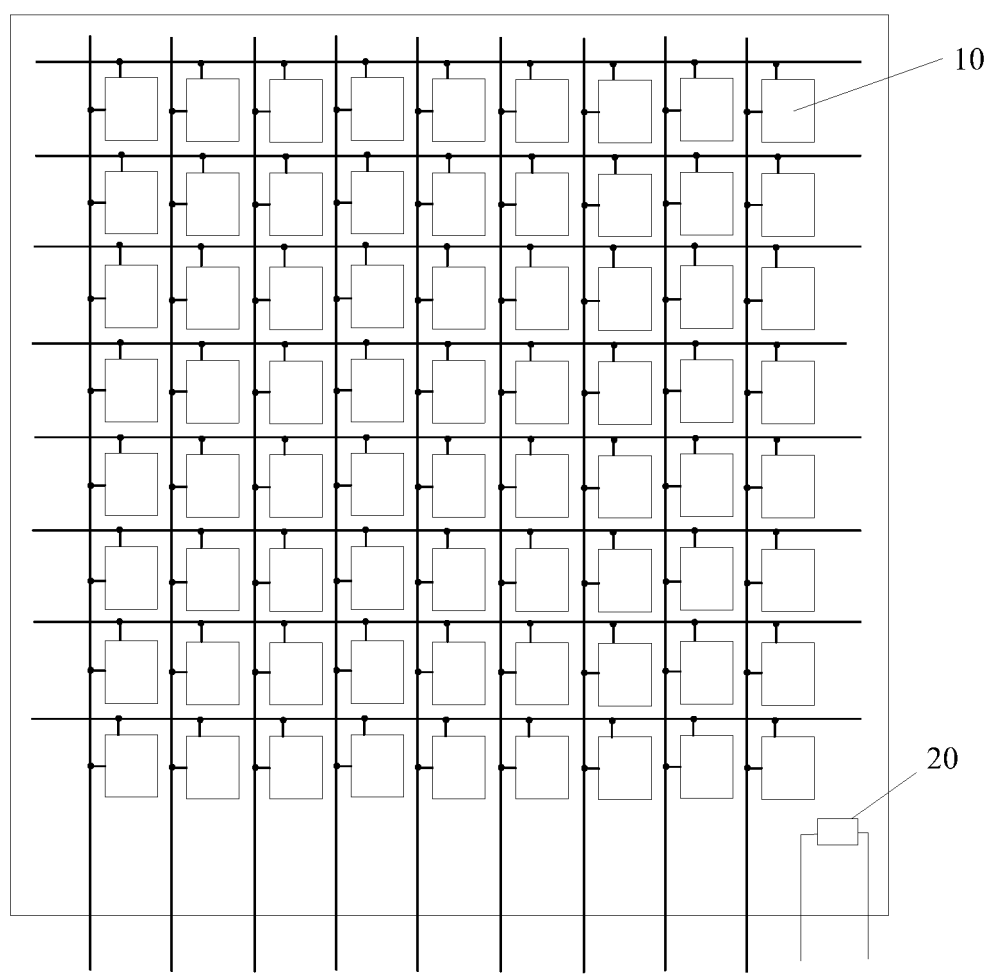
FIG. 1 illustrates an exemplary array substrate consistent with various disclosed embodiments in the present disclosure.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width, and depth should be considered during practical fabrication.

During the manufacturing process of a display panel, how to determine whether the display panel has undergone an aging process has become a technical problem to be solved urgently.

It is possible to perform manual detection of bright and dark spots in a display image of the display panel during the manufacturing process of the display panel to assist in determining whether the display panel has undergone an aging process. However, in the manufacturing process of the display panel, there are many factors that cause the display image to have bright and dark spots. Further, in the manufacturing process of the display panel, the aging process is performed in batches. Therefore, when detecting bright and dark spots on the display image of a display panel, if it is found that the display image of the display panel has poor bright and dark spots, it cannot be directly determined that the display panel has not undergone the aging process or whether the poor bright and dark spots are caused by other reasons. Therefore, it is necessary to perform bright and dark dot detection on each display panel produced in the same batch of the display panel, which is a huge workload and affects productivity.

Moreover, currently, when performing detection of poor bright and dark spots on the display image of the display panel, manual detection of the bright and dark spots in several specific display images s is mainly relied on. There are fewer detection display images, which are prone to miss detection and affect the yield rate of the display panel.

Figure 2:
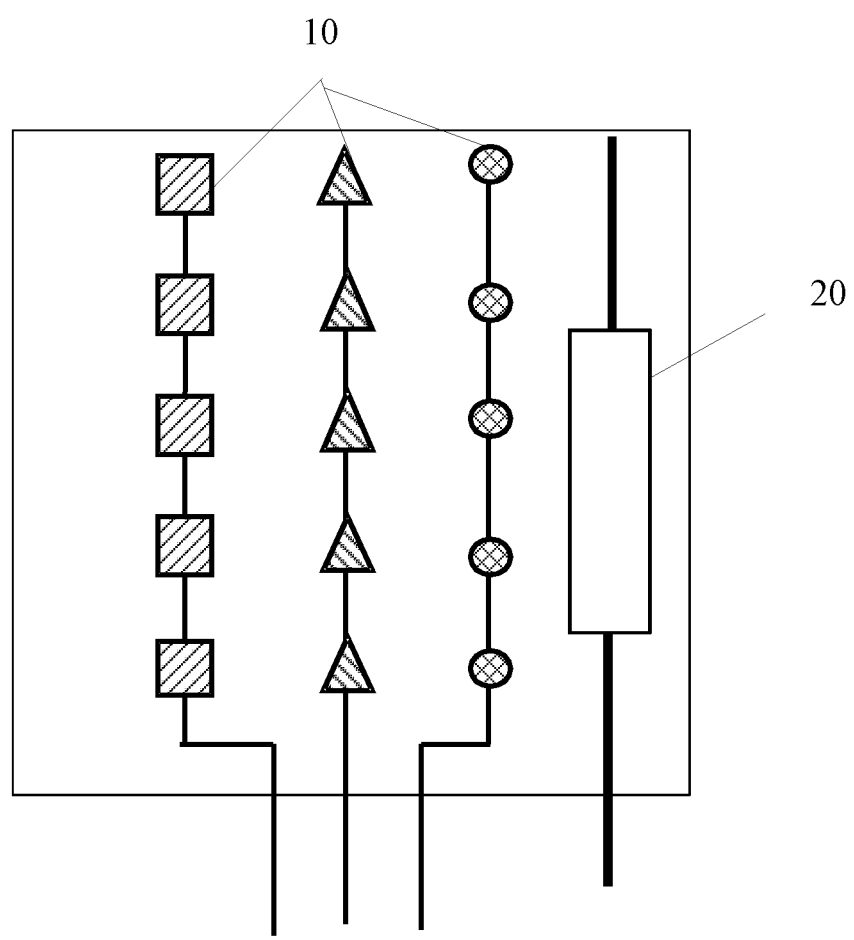
FIG. 2 illustrates a simplified view of an exemplary array substrate consistent with various disclosed embodiments in the present disclosure.

The present disclosure provides an array substrate, to at least partially alleviate above problems. In one embodiment, as illustrated in FIG. 1 and FIG. 2, the array substrate may include a plurality of display pixels 10 and at least one detection element 20. When the plurality of display pixels 10 are undergoing an aging process, a first driving signal may be applied to the at least one detection element 20, and the at least one detection element 20 may change from a first state to a second state. The second state may be different from the first state, and may indicate that the plurality of display pixels 10 has undergone the aging process.

In one embodiment, the plurality of display pixels may include red display pixels, blue display pixels, and green display pixels. In FIG. 2, display pixels with different shapes may correspond to display pixels with different colors. For example, square display pixels may correspond to red display pixels, triangle display pixels may correspond to blue display pixels, and circle display pixels may correspond to green display pixels. The embodiment is used as an example to illustrate the present disclosure and should not limit the scopes of the present disclosure. The correspondence relationship between the display pixels with different shapes and the display pixels with different colors may be configured according to actual needs.

In one embodiment, the first driving signal may be a high-voltage signal. For description purposes only, the embodiment where the first driving signal is the high-voltage signal will be used below as an example to illustrate the present disclosure.

Figure 3:
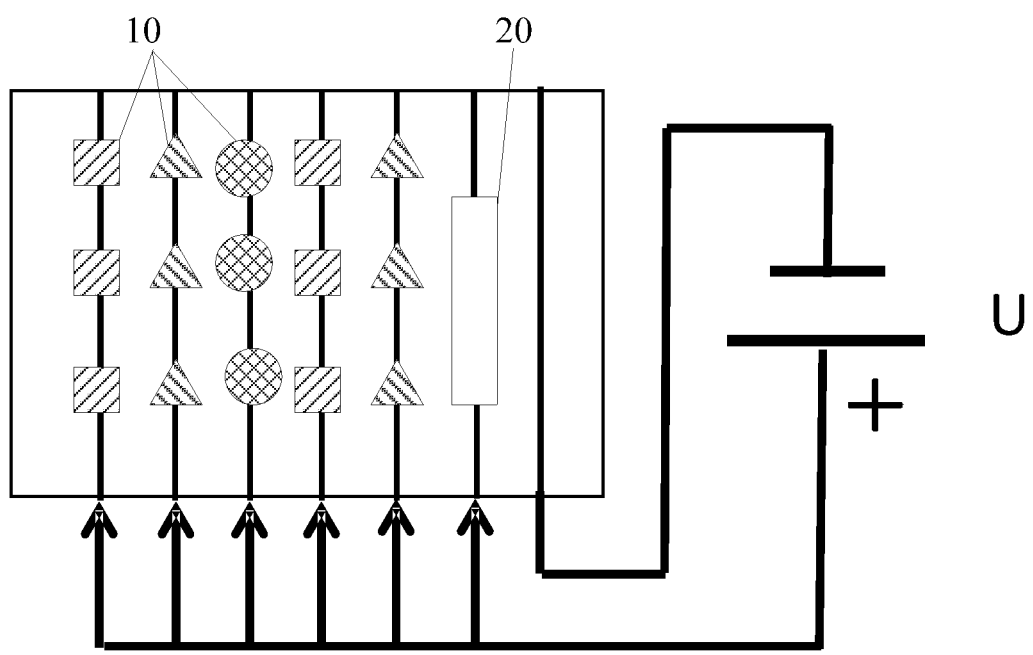
FIG. 3 illustrates a simplified view of an exemplary array substrate when an aging process is performed on a plurality of pixels consistent with various disclosed embodiments in the present disclosure.

As illustrated in FIG. 3, in one embodiment, when performing the aging process on the plurality of display pixel 10, a same voltage source U may be used to provide the high-voltage signal to the plurality of display pixels 10 and the at least one detection element 20 and a last period may be configured, to make the plurality of display pixels 10 undergo the aging process and the at least one detection element 20 change from the first state to the second state. A structure for providing the high-voltage signal to the plurality of display pixels 10 and the at least one detection element 20 may be simplified. The present embodiment is used as an example to illustrate the present disclosure only, and should not limit the scopes of the present disclosure. In some other embodiments, the high-voltage signal may be provided to the plurality of display pixels 10 and the at least one detection element 20 respectively, to make the plurality of display pixels 10 undergo the aging process and the at least one detection element 20 change from the first state to the second state.

In one embodiment, the array substrate may include one detection element, to simplify the structure of the array substrate. In some other embodiments, the array substrate may include at least two detection elements, to reduce the influence on determining whether the plurality of display pixels has undergone the aging process when one of the at least two detection elements is broken. The present disclosure has no limit on a number of the at least one detection element which can be configured according to actual needs.

In the present disclosure, when the plurality of display pixels is undergoing the aging process, the first driving signal may be applied to the at least one detection element. When the plurality of display pixels has undergone the aging process, the first driving signal may have been applied to the at least one detection element and correspondingly the at least one detection element may change from the first state to the second state. Correspondingly, whether the plurality of display pixels has undergone the aging process may be determined by detecting the state of the at least one detection element. Specifically, when the at least one detection element is in the first state, it may be determined that the plurality of display pixels has not undergone the aging process. When the at least one detection element is in the second state, it may be determined that the plurality of display pixels has undergone the aging process.

Figure 4:
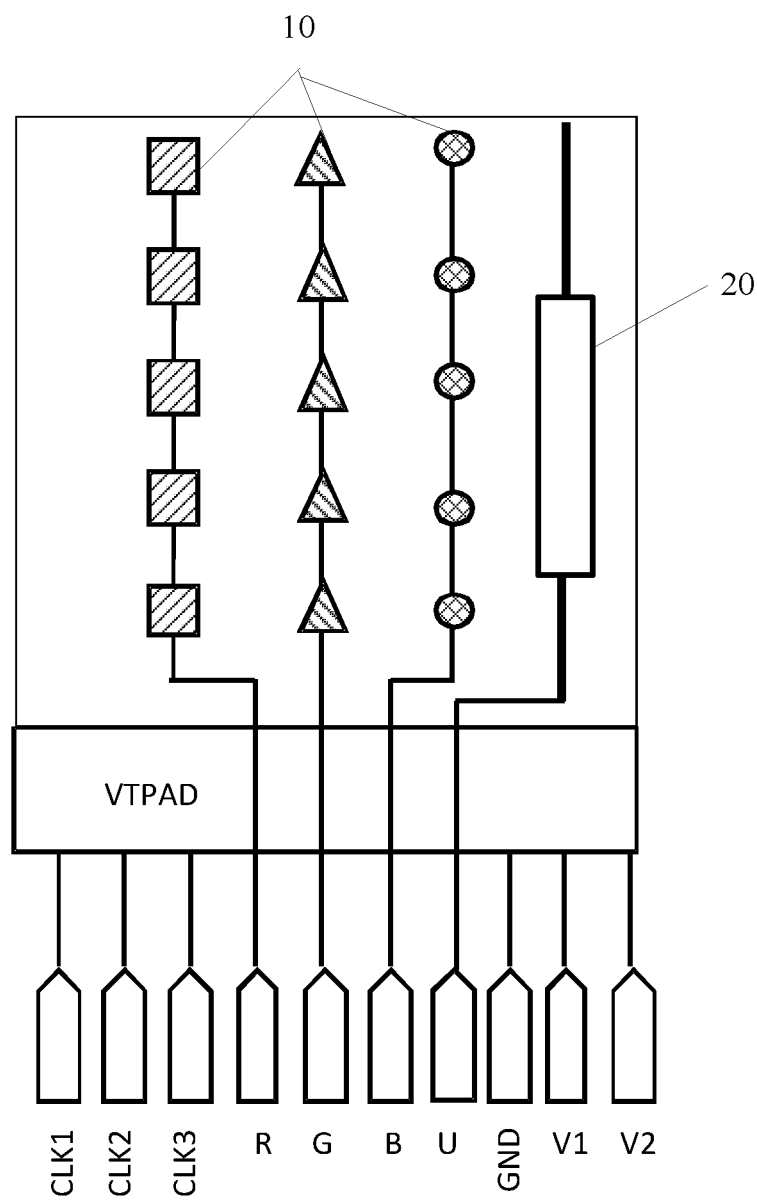
FIG. 4 illustrates a simplified view of another exemplary array substrate when an aging process is performed on a plurality of pixels consistent with various disclosed embodiments in the present disclosure.

As illustrated in FIG. 4 showing a simplified structure of an exemplary array substrate when the aging process is applied on the plurality of display pixels. A detection soldering pad (VTPA) may be electrically connected to a signal connection terminal of the array substrate. In actual application, a high-voltage signal may be provided to R, G, B, U, V1, V2 terminals of the detection soldering pad, to provide the high-voltage signal to the plurality of display pixels 10 and the at least one detection element 20. Correspondingly, the aging process may be applied on the plurality of display pixels 10 and the at least one detection element 20 may change from the first state to the second state.

In actual application, after using the detection soldering pad to apply the aging process on the plurality of display pixels 10, the detection soldering pad may be removed from the array substrate. In one embodiment, the array substrate may not include the detection soldering pad. This is used as an example to illustrate the present disclosure and should not limit the scopes of the present disclosure. The detection soldering pad may be configured according to actual needs.

In the array substrate provided by the embodiments of the present disclosure, the state of the at least one detection element may be used to determine whether the plurality of display pixels has undergone the aging process. Correspondingly, a heavy workload and the problem of missed inspection when using the detection of bright and dark spots to assist in determining whether the plurality of display pixels have undergone the aging process may be avoided.

Further, in one embodiment, when a voltage is applied between a first terminal and a second terminal of the at least one detection element, the first state of the at least one detection element may be a conductive state and the second state of the at least one detection element may be an disconnection state. Correspondingly, in one embodiment, after the fabrication of the array substrate is completed, a voltage may be applied to the at least one detection element to detect the state of the at least one detection element. When the at least one detection element is in the conductive state, it may be determined that the plurality of display pixels has not undergone the aging process. When the at least one detection element is in the disconnection state, it may be determined that the plurality of display pixels has undergone the aging process.

Figure 5:
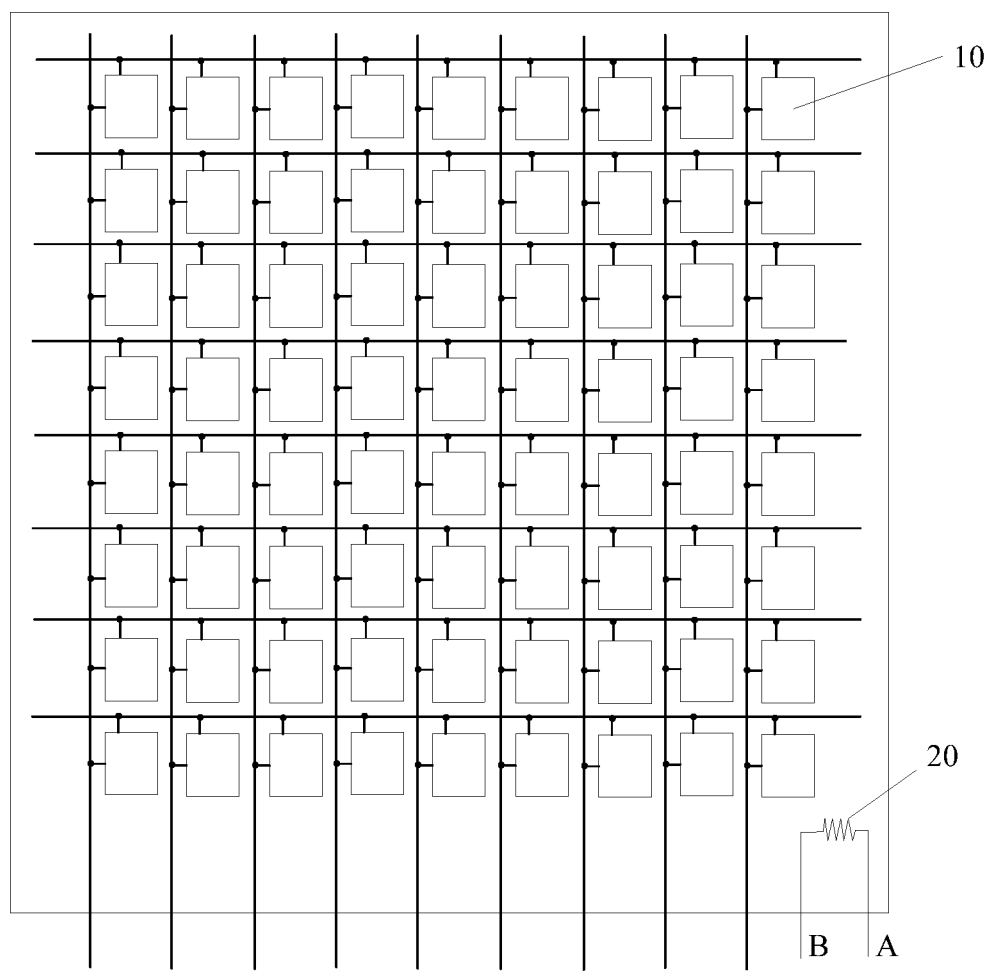
FIG. 5 illustrates another exemplary array substrate consistent with various disclosed embodiments in the present disclosure.
Figure 6:
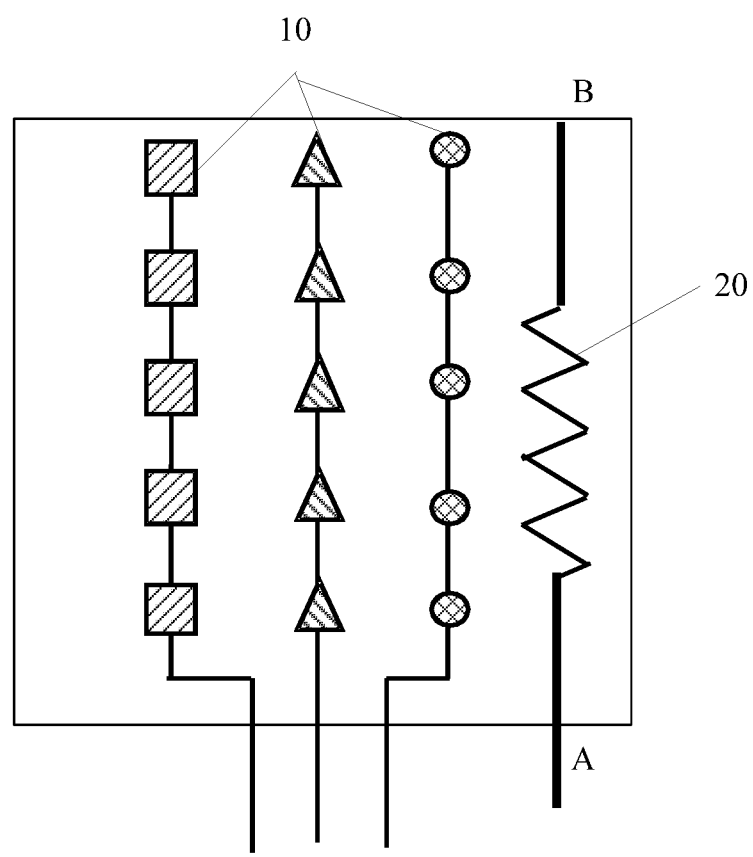
FIG. 6 illustrates a simplified view of another exemplary array substrate consistent with various disclosed embodiments in the present disclosure.

In one embodiment, as illustrated in FIG. 5 and FIG. 6, the at least one detection element 20 may be a fuse element, such that when a voltage is applied between the first terminal and the second terminal of the at least one detection element 20, the first state of the at least one detection element may be a conductive state and the second state of the at least one detection element may be an disconnection state.

In one embodiment, the fuse element may be a wire with a small width and high impedance, which may act as a fuse in the array substrate. That is, the at least one detection element may be added to the array substrate using fuse technology, to facilitate the use of the different states of the at least one detection element before and after the high-voltage treatment to enable detection of whether the plurality of display pixels have undergone the aging process. It should also be noted that the present disclosure does not limit the width of the fuse element which can be configured according to actual needs. Specifically, when the width of the fuse element is smaller, the blowing rate of the fuse element may be faster. That is, when the fuse element is thinner, the blowing rate of the fuse element may be faster.

Figure 7:
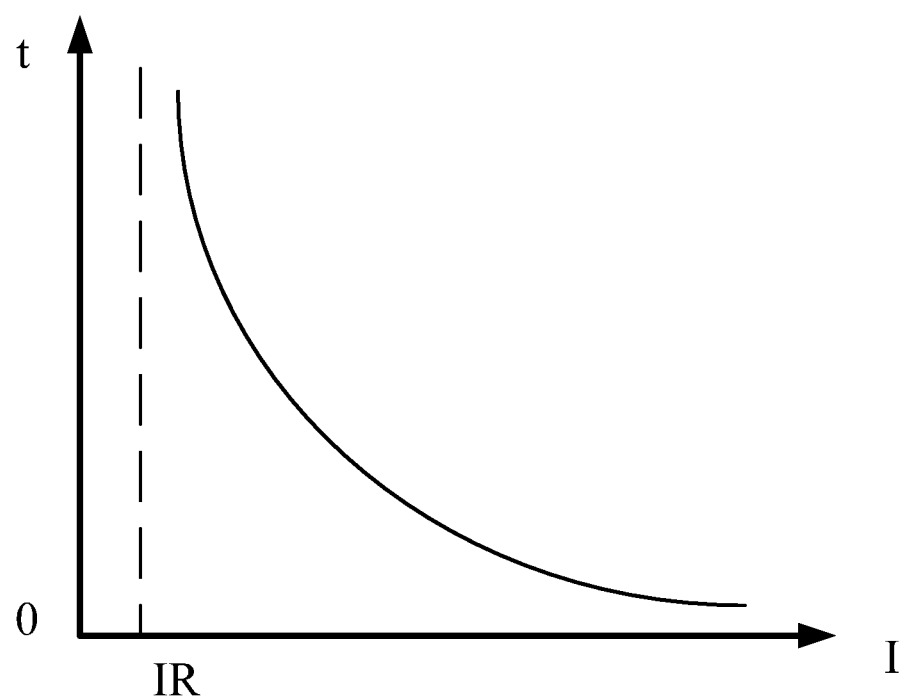
FIG. 7 illustrates an exemplary curve of a current of a fuse element with a time of applied voltage, consistent with various disclosed embodiments in the present disclosure.

Specifically, in one embodiment, the change of a current I of the fuse element as a lasting time of the applied voltage is shown in FIG. 7. The horizontal coordinate I represents the current flowing in the fuse element, and the vertical ordinate t represents the time for applying a high voltage to the fuse element. It can be seen from FIG. 7 that after applying a high voltage to the fuse element for a certain period, the current flowing through the fuse element may be substantially reduced to zero, and the fuse element may be blown.

Optionally, in one embodiment, the fuse element may be a metal fuse or a polysilicon fuse. For description purposes only, the embodiment is used as an example to illustrate the present disclosure, and should not limit the scopes of the present disclosure. In various embodiments, the fuse element may be any suitable fuse, as long as it is guaranteed that the first state of the at least one detection element is the conductive state and the second state of the at least one detection element is the disconnection state when a voltage is applied between the first terminal and the second terminal of the at least one detection element.

Specifically, in one embodiment, when the fuse element is a metal fuse, the fuse element may be made of a metal including nickel, titanium, or cobalt. For description purposes only, the embodiment is used as an example to illustrate the present disclosure, and should not limit the scopes of the present disclosure. In various embodiments, the fuse element may be made of any suitable material.

Further, in one embodiment, as illustrated in FIG. 5 and FIG. 6, the first terminal of the at least one detection element 20 may be electrically connected to a first signal connection terminal A of the array substrate, and the second terminal of the at least one detection element 20 may be electrically connected to a third signal connection terminal B of the array substrate. Correspondingly, the first signal connection terminal A of the array substrate and the third signal connection terminal B of the array substrate may be used to apply a voltage between the two terminals of the at least one detection element 20, to facilitate the use of the different states of the at least one detection element 20 before and after the high-voltage treatment to enable detection of whether the plurality of display pixels 10 have undergone the aging process.

For description purposes only, in the embodiment illustrated in FIG. 6, the first signal connection terminal A of the array substrate and the third signal connection terminal B of the array substrate may be disposed different sides of the array substrate. The embodiment in FIG. 6 is used as an example to illustrate the present disclosure, and should not limit the scopes of the present disclosure. In various embodiments, the first signal connection terminal A of the array substrate and the third signal connection terminal B of the array substrate may be disposed at any suitable positions and can be configured according to actual needs. For example, in one embodiment illustrated in FIG. 5, the first signal connection terminal A of the array substrate and the third signal connection terminal B of the array substrate may be disposed at a same side of the array substrate.

Figure 8:
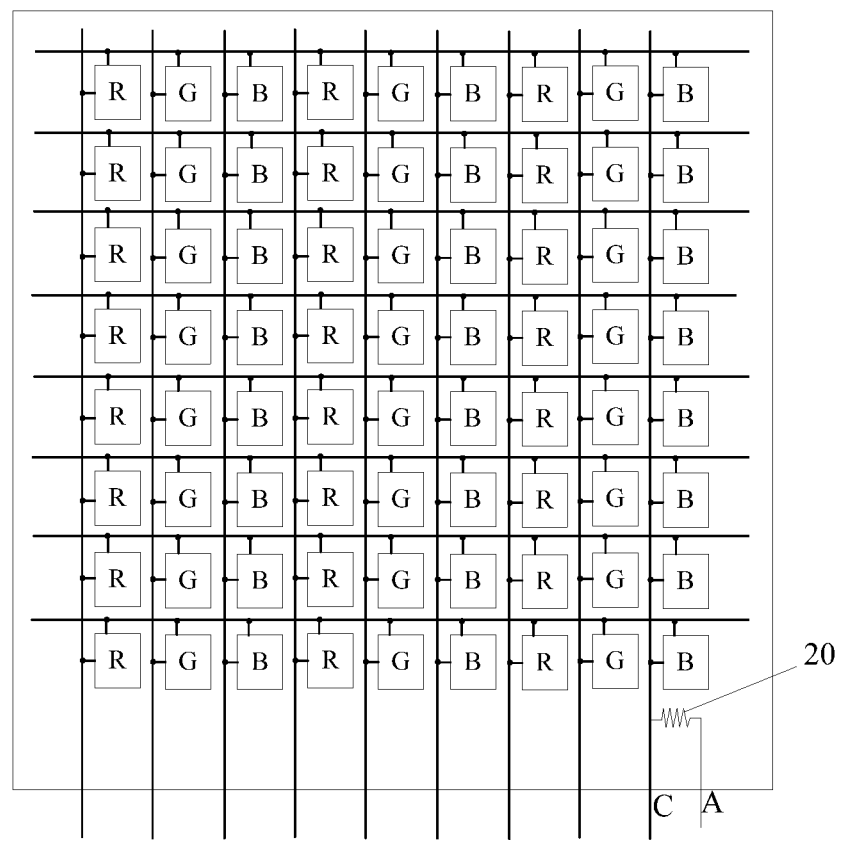
FIG. 8 illustrates another exemplary array substrate consistent with various disclosed embodiments in the present disclosure.
Figure 9:
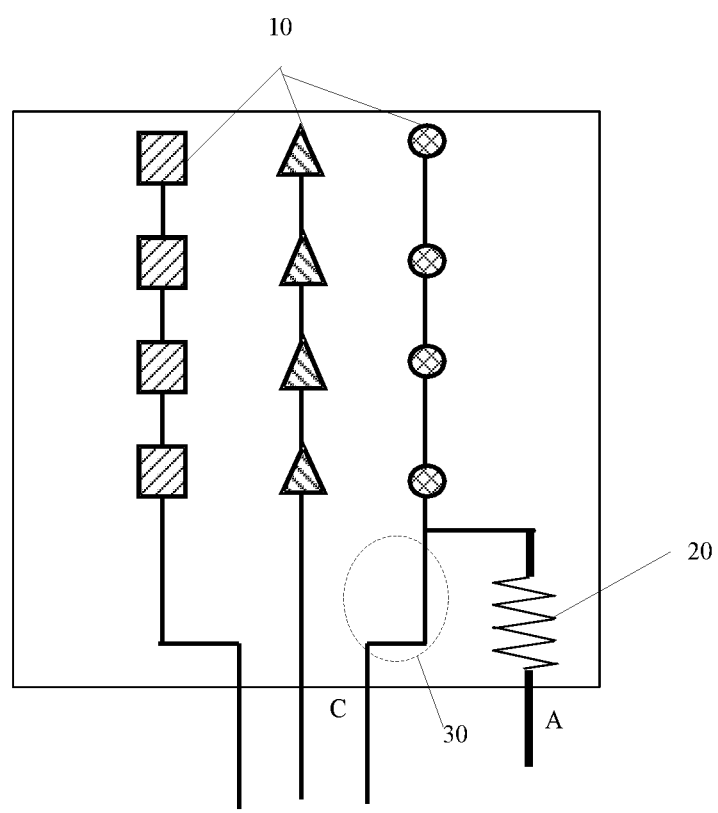
FIG. 9 illustrates a simplified view of another exemplary array substrate consistent with various disclosed embodiments in the present disclosure.

In one embodiment illustrated in FIG. 8 and FIG. 9 which is a partially enlarged view of FIG. 8. The display pixels of different shapes in FIG. 9 may correspond to the display pixels of different colors in FIG. 8. Specifically, a square display pixel may correspond to a red display pixel, a triangular display pixel may correspond to a green display pixel, and a circle display pixel may correspond to a blue display pixel. The first terminal of the at least one detection element 20 may be electrically connected to the first signal connection terminal A of the array substrate, and the second terminal may be electrically connected to at least one display pixel 10 of the plurality of display pixels 10. Specifically, in one embodiment, the at least one detection element 20 may be connected in parallel with a preset path 30, and the preset path 30 may be located at a second signal connection terminal C of the array substrate and the at least one display pixel 10. Further, one end of the preset path 30 may be connected to the second signal connection terminal C of the array substrate, and another terminal may be connected to the at least one display pixel 10.

In the present disclosure, the at least one detection element may be connected in parallel with the preset path connecting the at least one display pixel and the second signal connection terminal. Therefore, when the at least one detection element is in the conductive state, the signal of the second signal connection terminal of the array substrate may be transmitted to the at least one display pixel through the preset path, and the signal input from the first signal connection terminal of the array substrate may also be transmitted to the at least one display pixel. When the at least one detection element is in an disconnection state, only the signal from the second signal connection terminal of the array substrate can be transmitted to the at least one display pixel through the preset path, and the signal input from the first signal connection terminal of the array substrate cannot be transmitted to the at least one display pixel. Correspondingly, the state of the at least one detection element can be determined by the display state of at least one display pixel connected to the at least one detection element, to determine whether the plurality of display pixels has undergone the aging process.

Figure 10:
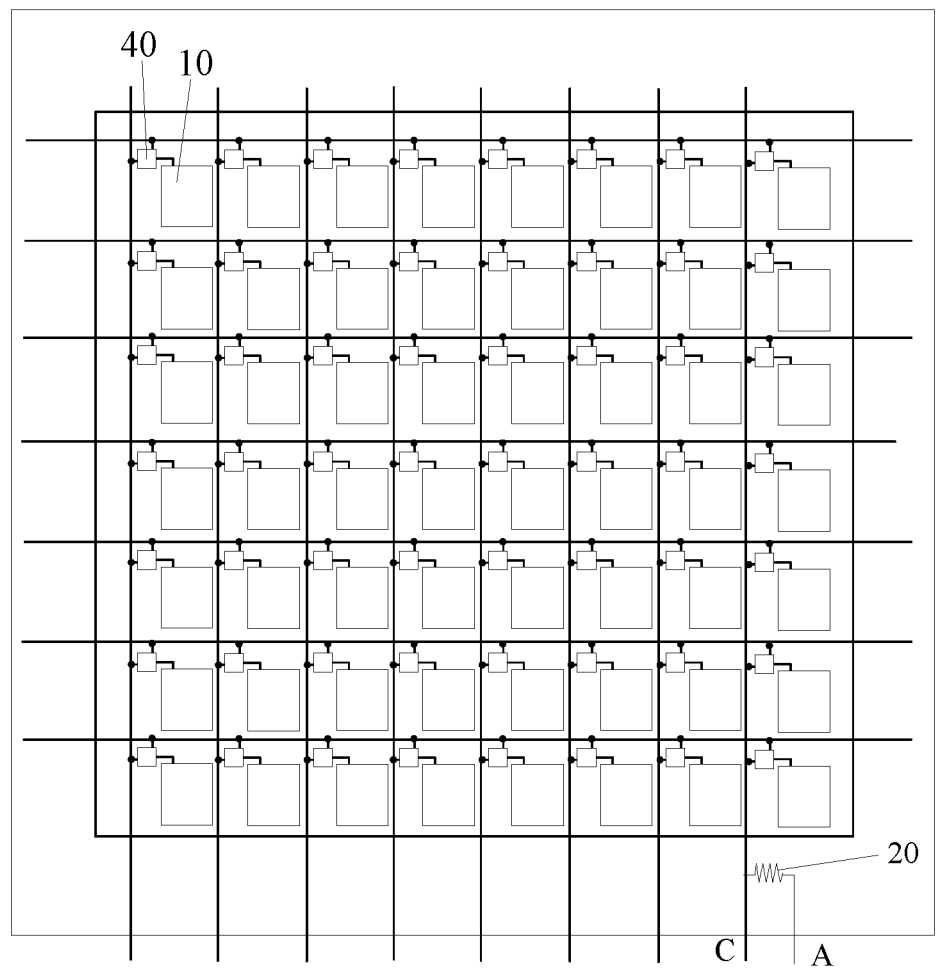
FIG. 10 illustrates another exemplary array substrate consistent with various disclosed embodiments in the present disclosure.
Figure 11:
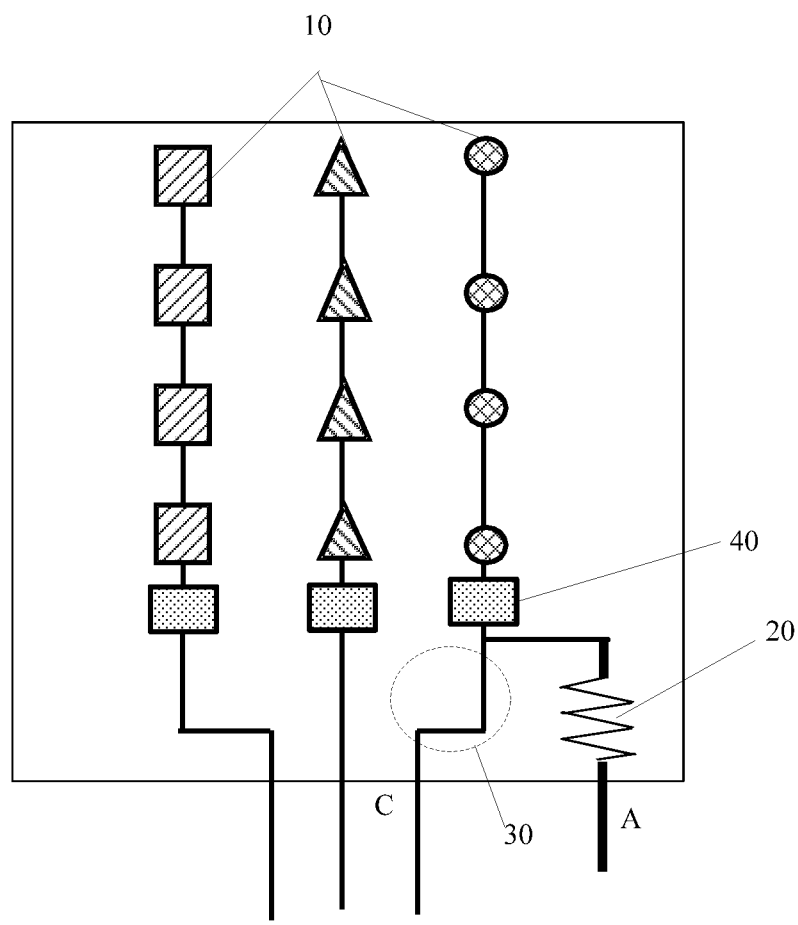
FIG. 11 illustrates a simplified view of another exemplary array substrate consistent with various disclosed embodiments in the present disclosure.

In one embodiment illustrated in FIG. 10 and FIG. 11, the array substrate may further include a pixel driving circuit 40 between each second signal line connection terminals C and a corresponding one of the plurality of display pixels 10. Each pixel driving circuit 40 may include a thin film transistor for controlling a state of corresponding one of the plurality of display pixels 10. In one embodiment, the at least one detection element 20 may be connected to at least one of the plurality of display pixels 10 through the pixel driving circuits 40.

Figure 12:
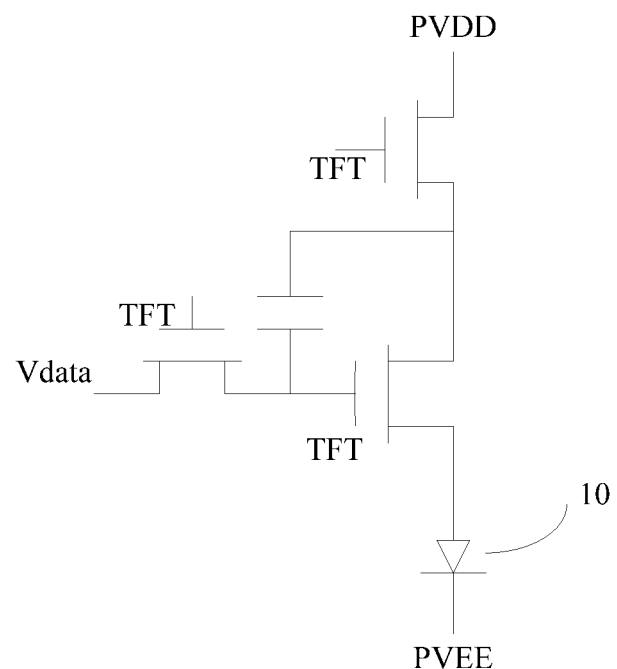
FIG. 12 illustrates a structure of a pixel driving circuit of an exemplary array substrate consistent with various disclosed embodiments in the present disclosure.

In one embodiment illustrated in FIG. 12, a pixel driving circuit may include a plurality of thin film transistors TFT. A first terminal of the pixel driving circuit may input voltage PVDD, a second terminal may input voltage Vdata, and the third terminal may input voltage PVEE. Difference PVDD−Vdata between the voltage PVDD input through the first terminal of the pixel driving circuit and the voltage Vdata input through the second terminal of the pixel driving circuit may be applied to an anode of a corresponding display pixel 10 of the plurality of display pixels. The voltage PVEE input through the third terminal of the pixel driving circuit may be applied to a cathode of the corresponding display pixel 10. When a voltage difference PVDD−Vdata−PVEE between the two terminals of the corresponding display pixel 10 is larger than a conductive voltage Voled of the corresponding display pixel 10, the corresponding display pixel may emit light to display.

In one embodiment, a second signal connection terminal of the array substrate may be connected to the second terminal of a corresponding pixel driving circuit, to provide the voltage Vdata to the corresponding pixel driving circuit. The first terminal of the at least one detection element may be connected to one first signal connection terminal A of the array substrate, and the second terminal may be connected to the second terminal of a corresponding pixel driving circuit and a common terminal of the second signal connection terminals of the array substrate.

In the present disclosure, when the second signal connection terminal of the array substrate inputs a low voltage Vdata and the first signal connection terminal of the array substrate inputs a high voltage VGH, if the at least one detection element is in the disconnection state, the high voltage input through the first signal connection terminal may not be transmitted through the at least one detection element to the at least one display pixel electrically connected to the at least one detection element. The voltage applied to the anode of the at least one display pixel may be PVDD−Vdata. Correspondingly, the voltage difference between the anode and the cathode of the at least one display pixel may be large, and the at least one display pixel that is electrically connected to the at least one detection element may be in a lighted state, If the at least one detection element is in the conductive state, the high voltage input through the first signal connection terminal may be transmitted through the at least one detection element to the at least one display pixel electrically connected to at least one the detection element. At this time, the voltage applied to the anode of the at least one display pixel is PVDD−VGH, and the voltage difference between the anode and the cathode of the at least one display pixel may be small. Correspondingly, the at least one display pixel electrically connected to the at least one detection element may be in an off state.

Correspondingly, in the present disclosure, the state of the at least one detection element may be determined based on the display state of the at least one display pixel electrically connected to the at least one detection element. When the at least one display pixel electrically connected to the at least one detection element is in the lighted state, the at least one detection element may be determined to be in the disconnection state (the second state). When the at least one display pixel electrically connected to the at least one detection element is in the off state, the at least one detection element may be determined to be in the conductive state (the first state).

Figure 13:
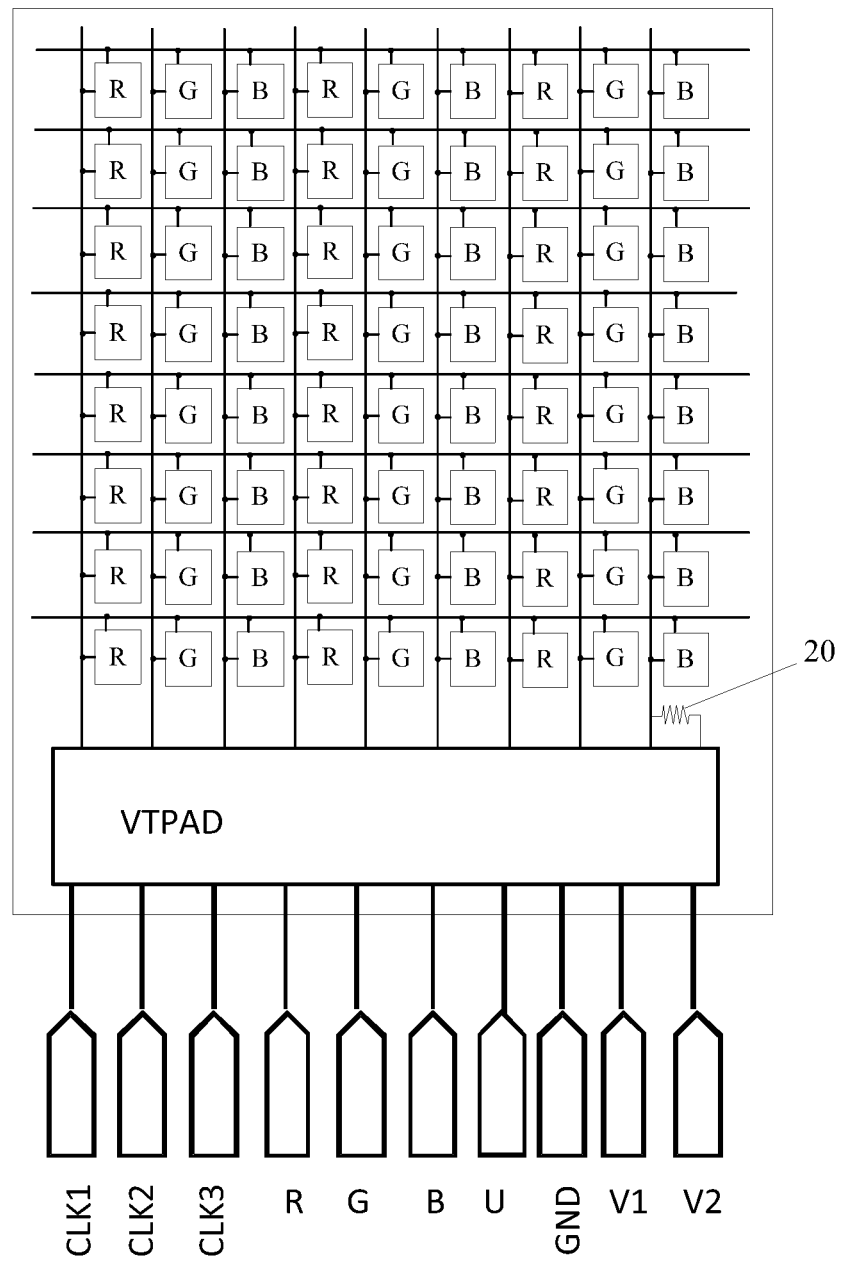
FIG. 13 illustrates a structure of another exemplary array substrate when an aging process is performed on a plurality of pixels consistent with various disclosed embodiments in the present disclosure.
Figure 14:
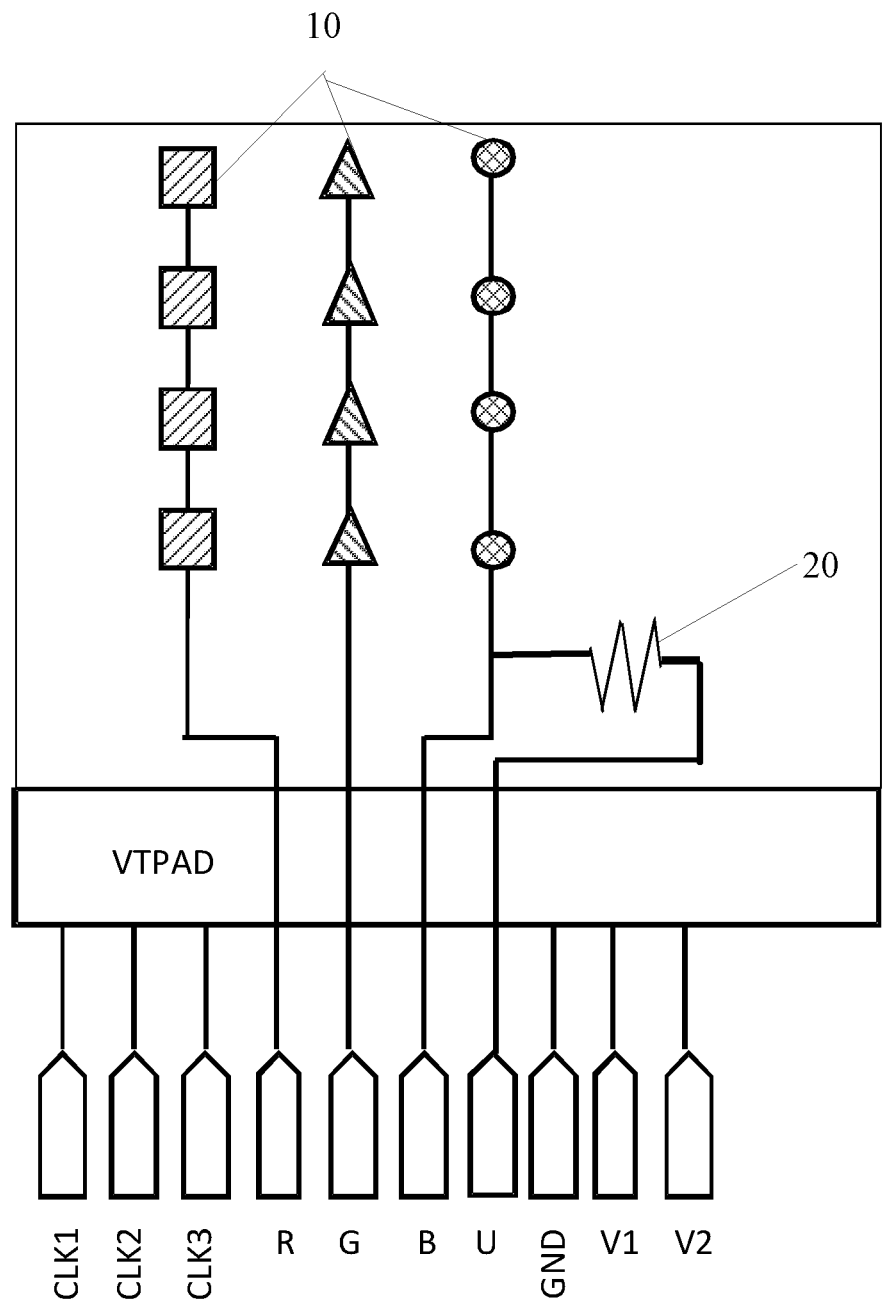
FIG. 14 illustrates a simplified view of another exemplary array substrate when an aging process is performed on a plurality of pixels consistent with various disclosed embodiments in the present disclosure.

In one embodiment as illustrated in FIG. 13 and FIG. 14, when performing the aging process on the plurality of display pixels 10, the high voltage may be applied to the R, G, B, and U terminals of the detection soldering pad VTPAD to perform the aging process on the plurality of display pixels 10. After completing the aging process on the plurality of display pixels 10, the voltage on the at least one display pixel electrically connected to the at least one detection element may be removed, that is, the voltage input through the second signal connection terminal of the array substrate may be removed, to make the second signal connection terminal be low voltage or floating. At this time, the high voltage may be input through the first signal connection terminal, and the at least one detection element 20 may conduct and generate heat to melt.

Figure 15:
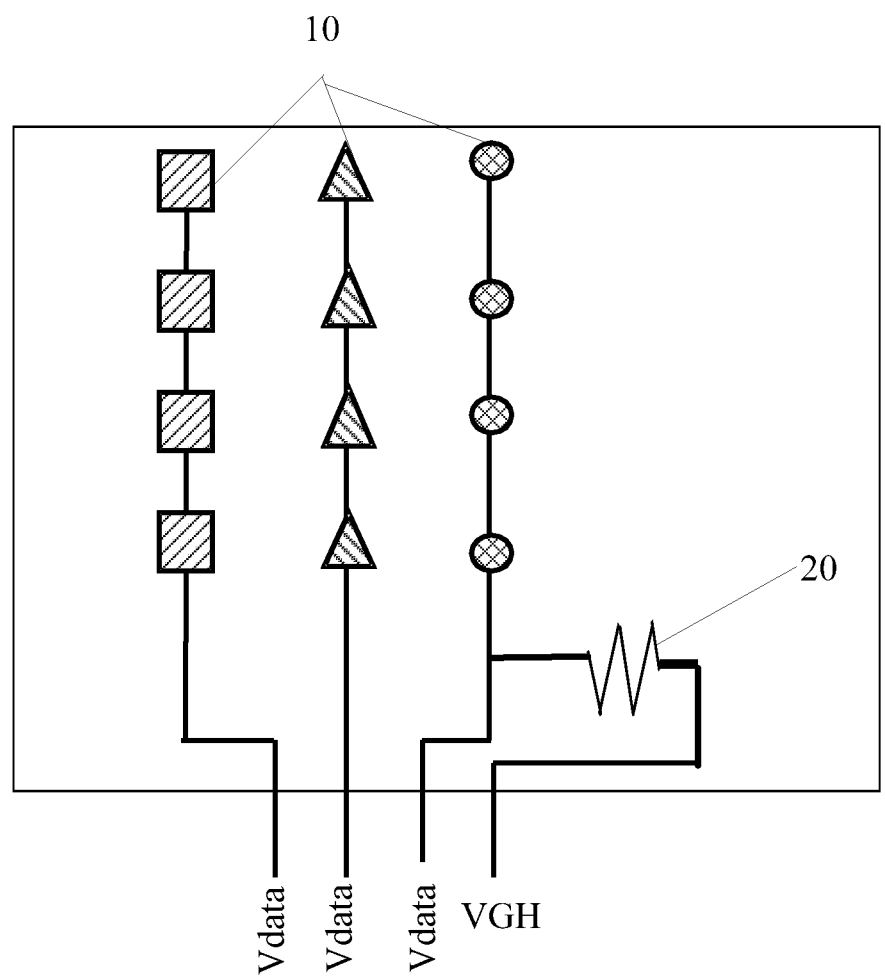
FIG. 15 illustrates a simplified view of another exemplary array substrate without an aging process performed on a plurality of pixels consistent with various disclosed embodiments in the present disclosure.
Figure 16:
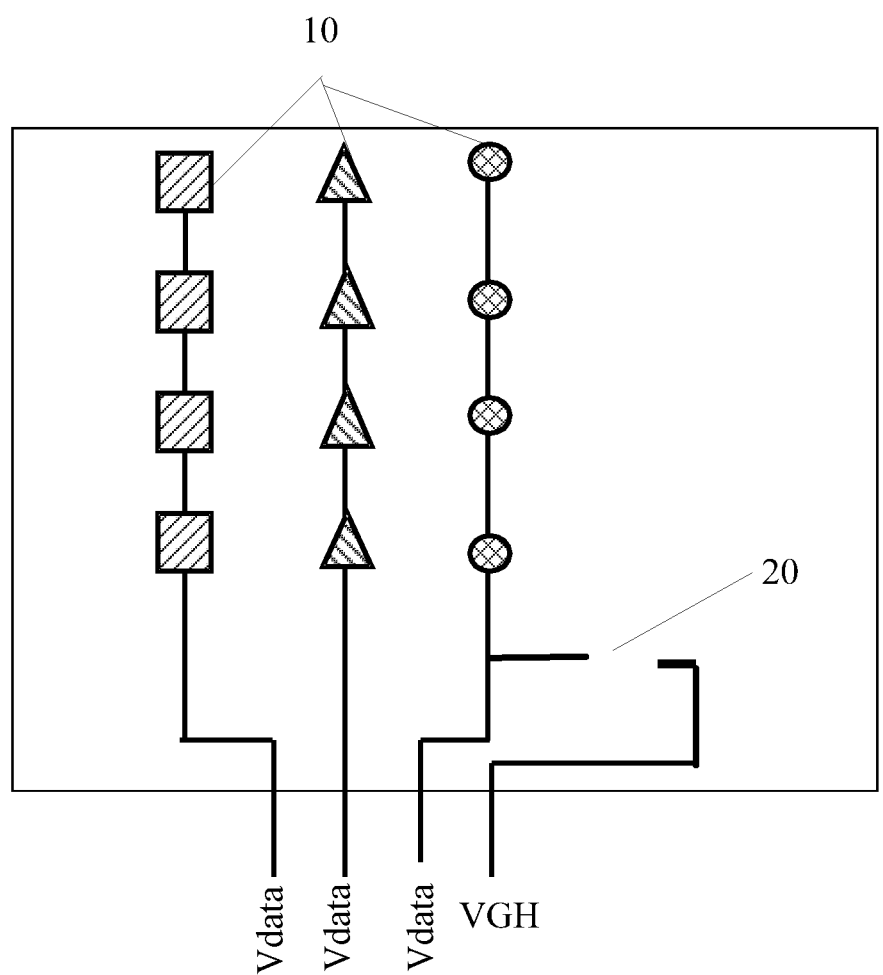
FIG. 16 illustrates a simplified view of another exemplary array substrate after an aging process is performed on a plurality of pixels consistent with various disclosed embodiments in the present disclosure.

Correspondingly, after the detection soldering pad VTPAD is cut and removed, as illustrated in FIG. 15 and FIG. 16, the at least one detection element 20 may be electrically connected to a high voltage, and the voltage of the at least one display pixel 10 may be pulled down to the low voltage Vdata. At this time, when the at least one display pixel 10 electrically connected to the at least one detection element 20 does not emit light, it may be determined that the at least one detection element 20 is not melted and the plurality of display pixels 10 has not undergone the aging process, as illustrated in FIG. 15. When the at least one display pixel 10 is electrically connected to the at least one detection element 20 emits light, it may be determined that the at least one detection element 20 is melt and the plurality of display pixels 10 has undergone the aging process.

In the present disclosure, whether the plurality of display pixels has undergone the aging process may be determined according to the display state of the at least one display pixel electrically connected to the at least one detection element. Specifically, when the second signal connection terminal of the array substrate inputs a low voltage and the first signal connection terminal inputs a high voltage, when the at least one display pixel electrically connected to the at least one detection element does not emit light, it may be determined that the plurality of display pixels has not undergone the aging process. When the at least one display pixel is electrically connected to the at least one detection element emits light, it may be determined that the plurality of display pixels has undergone the aging process. The determination of whether the plurality of display pixels has undergone the aging process may be more intuitive.

As illustrated in FIG. 15 and FIG. 16, after the detection soldering pad VTPAD is cut and removed, the at least one detection element 20 may be electrically connected to a high voltage VGH, and the voltage of the at least one display pixel 10 may be pulled down to the low voltage Vdata. That is, the high voltage may be applied to the first signal connection terminal of the array substrate and the low voltage may be applied to the second signal connection terminal of the array substrate. When the at least one detection element 20 is not melted, as illustrated in FIG. 15, the second signal connection terminal of the array substrate may be pulled up to the high voltage by the high voltage of the first signal connection terminal of the array substrate. When the at least one detection element 20 is melt, as illustrated in FIG. 16, the second signal connection terminal of the array substrate may maintain the low voltage.

Correspondingly, in one embodiment, the high voltage may be applied to the first signal connection terminal and the voltage on the second signal connection terminal may be detected, to determine the state of the at least one detection element. When the voltage on the second signal connection terminal is high, the at least one detection element may be determined to be in the conductive state (the first state). When the voltage on the second the at least one detection element is the low voltage, the at least one detection element may be determined to be in the disconnection state (the second state).

In the present disclosure, the voltage on the second signal connection terminal may be detected, to determine whether the plurality of display pixels has undergone the aging process. The second signal connection terminal of the array substrate may input the low voltage and the first signal connection terminal of the array substrate may input the high voltage. Correspondingly, when the voltage on the second the at least one detection element is the low voltage, it may be determined that the plurality of display pixels has undergone the aging process; and when the voltage on the second signal connection terminal is the high voltage, it may be determined that the plurality of display pixels has not undergone the aging process. The determination of whether the plurality of display pixels has undergone the aging process may be quicker.

For description purposes only, the above embodiments where the first state of the at least one detection element is the conductive state and the second state of the at least one detection element is the disconnection state are used as examples to illustrate the present disclosure and should not limit the scopes of the present disclosure. In some other embodiments, when a voltage is applied between the first terminal and the second terminal of the at least one detection element, the second state of the at least one detection element may be the conductive state and the first state of the at least one detection element may be the disconnection state.

In one embodiment, when a voltage is applied between the first terminal and the second terminal of the at least one detection element, the second state of the at least one detection element may be the conductive state and the first state of the at least one detection element may be the disconnection state. The state of the at least one detection element may be used to determine whether the plurality of display pixels has undergone the aging process.

In one embodiment, when a voltage is applied between the first terminal and the second terminal of the at least one detection element, the second state of the at least one detection element may be the conductive state and the first state of the at least one detection element may be the disconnection state. Correspondingly, after the fabrication of the array substrate, a voltage may be applied to the at least one detection element to detect the state of the at least one detection element. When the at least one detection element is in the disconnection state, it may be determined that the plurality of display pixels has not undergone the aging process. When the at least one detection element is in the conductive state, it may be determined that the plurality of display pixels has undergone the aging process.

Figure 17:
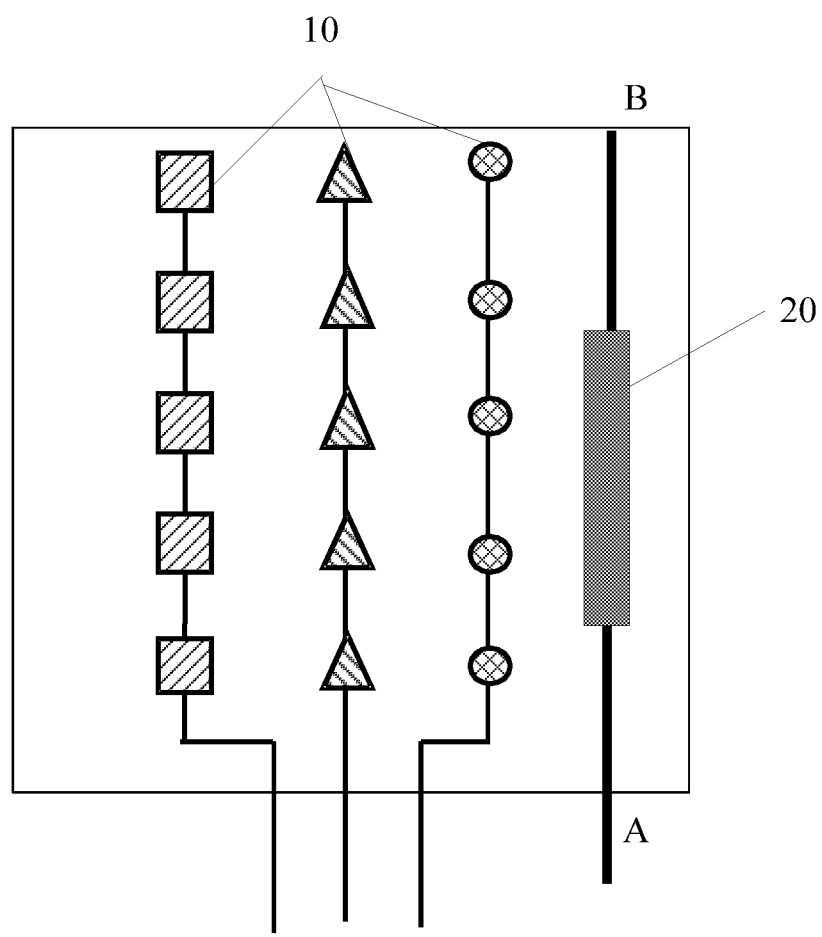
FIG. 17 illustrates a simplified view of another exemplary array substrate consistent with various disclosed embodiments in the present disclosure.
Figure 18:
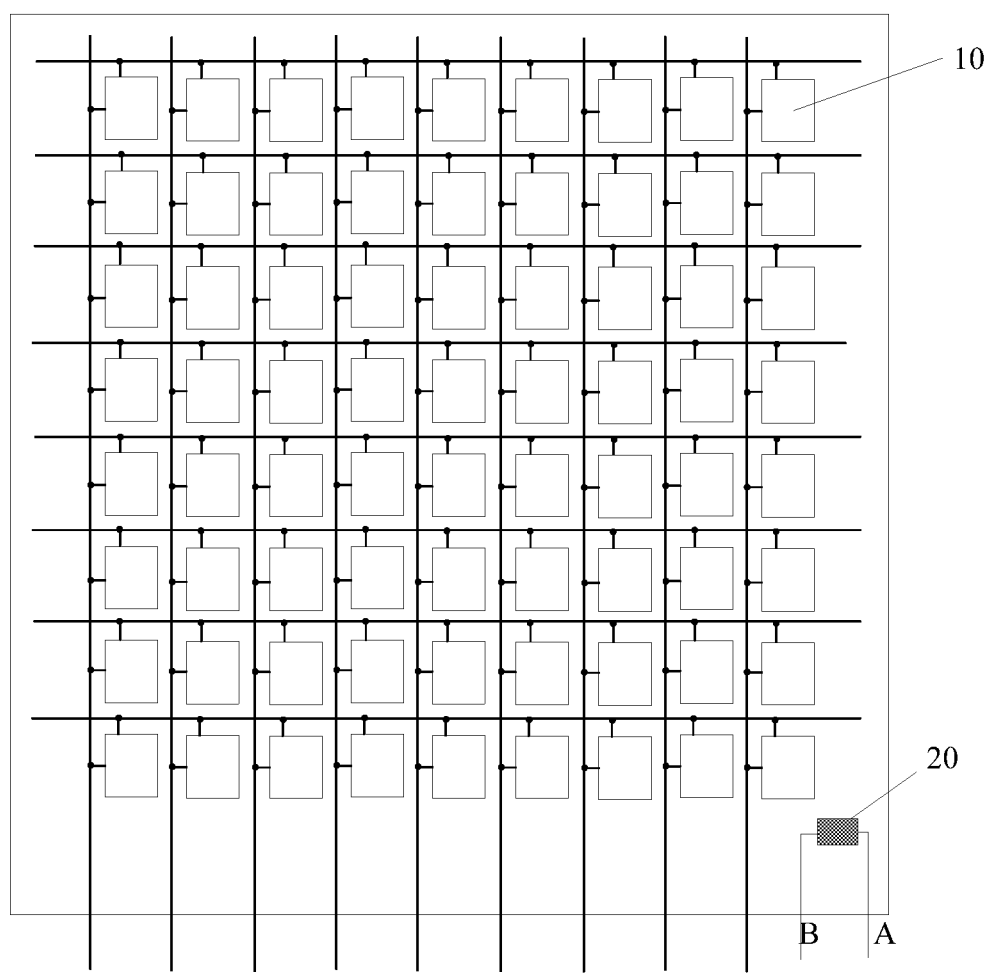
FIG. 18 illustrates another exemplary array substrate consistent with various disclosed embodiments in the present disclosure.

In one embodiment illustrated in FIG. 17 and FIG. 18, the first terminal of the at least one detection element 20 may be connected to the first signal connection terminal A of the array substrate, and the second terminal of the at least one detection element 20 may be connected to the third signal connection terminal B of the array substrate. Correspondingly, the voltage may be applied to two terminals of the at least one detection element 20 through the first signal connection terminal A and the third signal connection terminal B of the array substrate. A subsequent process for determining whether the plurality of display pixels 10 has undergone the aging process by detecting the state of the at least one detection element may be facilitated.

Figure 19:
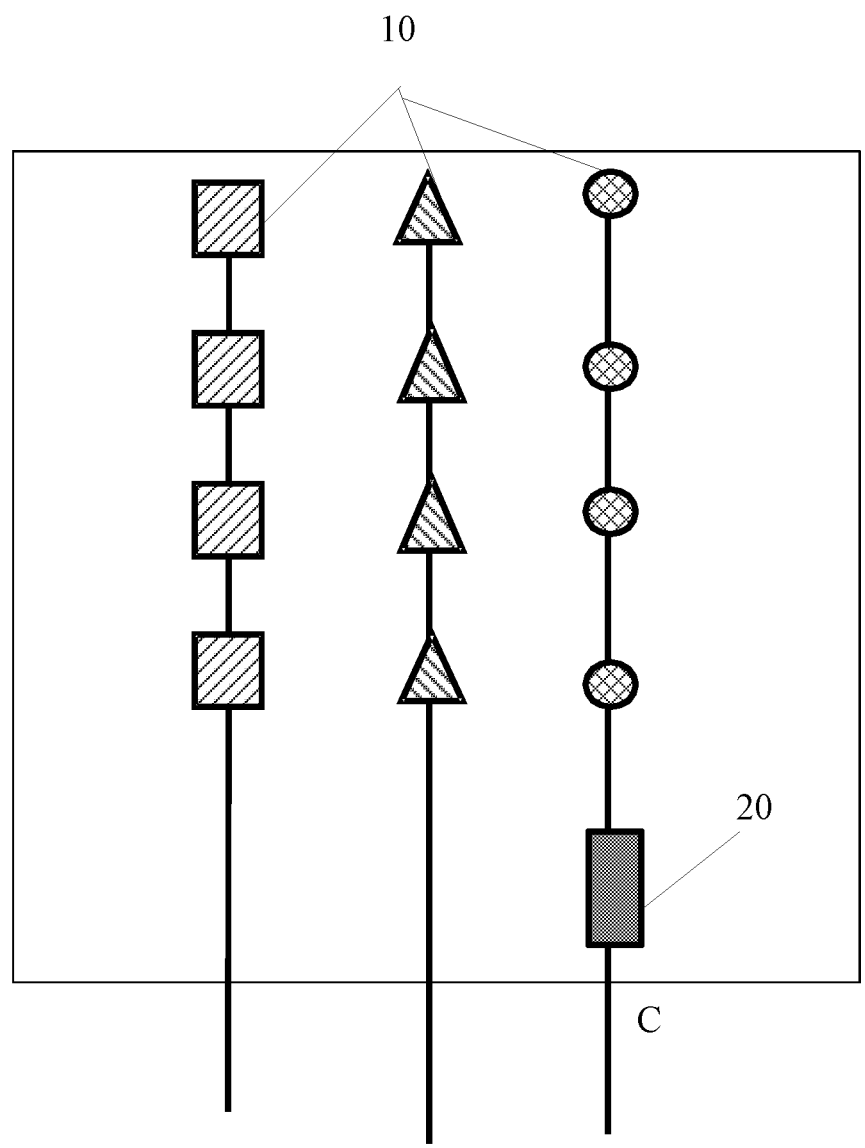
FIG. 19 illustrates a simplified view of another exemplary array substrate consistent with various disclosed embodiments in the present disclosure.
Figure 20:
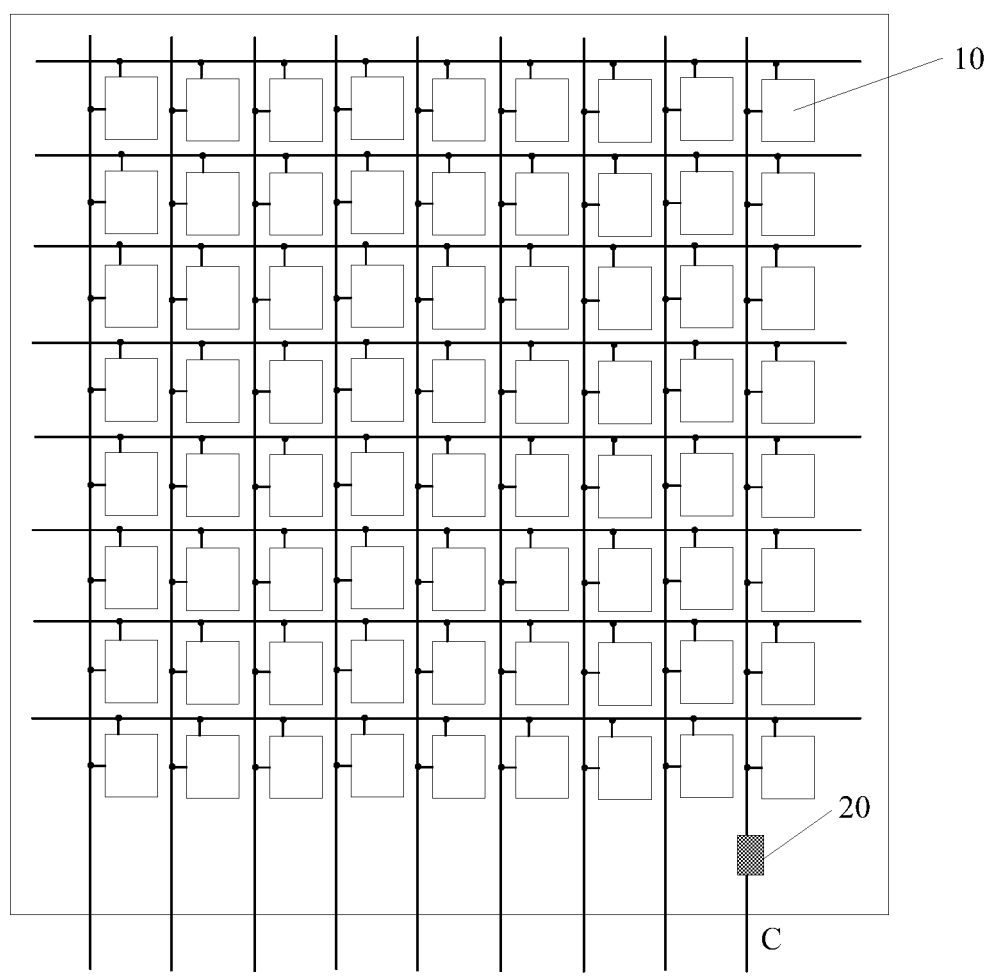
FIG. 20 illustrates another exemplary array substrate consistent with various disclosed embodiments in the present disclosure.

In one embodiment illustrated in FIG. 19 and FIG. 20, the at least one detection element 20 may be connected to at least one display pixel 10 of the plurality of display pixels 10 in series. One terminal of the at least one detection element 20 may be connected to the second signal connection terminal C of the array substrate, and another terminal may be connected to the at least one display pixel 10. Specifically, the at least one detection element 20 may be connected to the at least one display pixel 10 in series. When the at least one detection element 20 is in the disconnection state, the signal from the second signal connection terminal C cannot be transmitted to the at least one display pixel 10. When the at least one detection element 20 is in the conductive state, the signal from the second signal connection terminal C can be transmitted to the at least one display pixel 10. Correspondingly, in the present embodiment, the state of the at least one detection element 20 may be determined by detecting the display status of the at least one display pixel 10 connected to the at least one detection element 20 in series, to determine whether the plurality of display pixels 10 has undergone the aging process.

Figure 21:
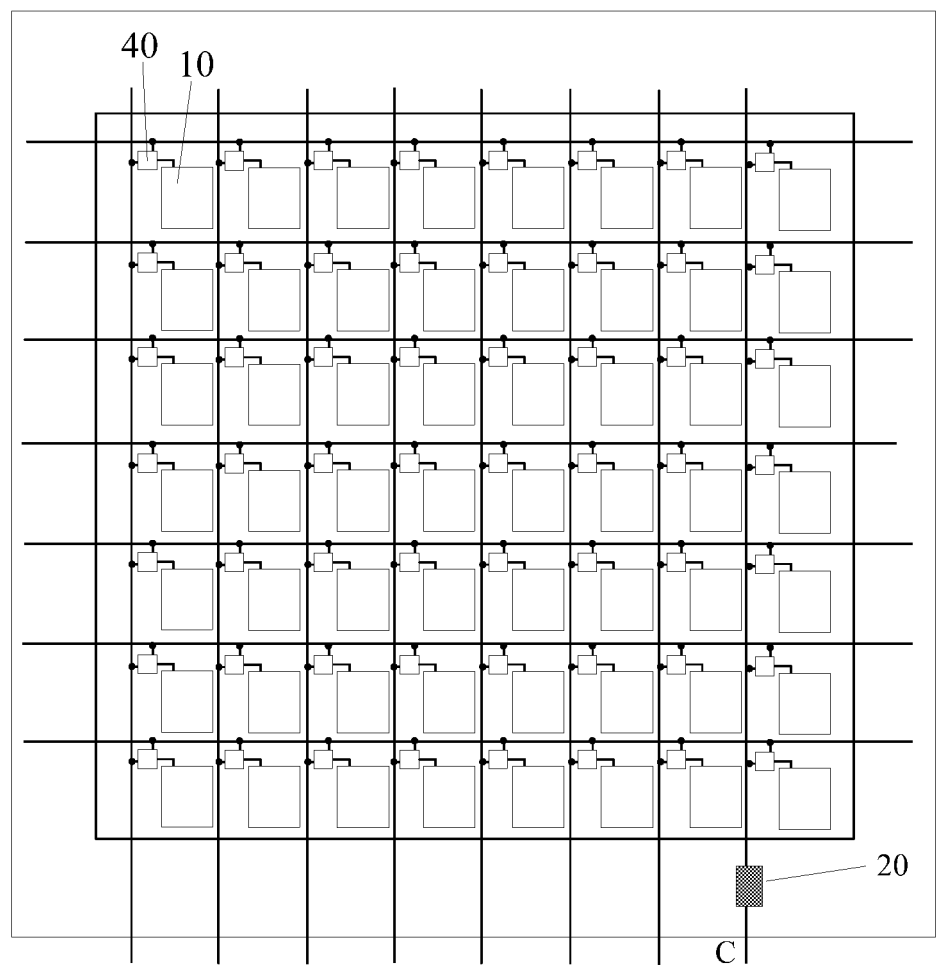
FIG. 21 illustrates another exemplary array substrate consistent with various disclosed embodiments in the present disclosure.

In one embodiment, as illustrated in FIG. 21, the array substrate may further include a pixel driving circuit 40 between the at least one detection element 20 and the at least one display pixel 10. The pixel driving circuit 40 may include thin film transistors for controlling the state of the at least one display pixel 10. In one embodiment, the second signal connection terminal C of the array substrate may be connected to a second terminal of the pixel driving circuit 40 through the at least one detection element 20.

A voltage between the at least one detection element and a common terminal of the pixel driving circuit may be Vdata1, and the voltage from the second signal connection terminal may be Vdata. Vdata may be a constant, and Vdata1 may be a difference between Vdata and a voltage drop $\Delta V$ on the at least one detection element. In one embodiment, the voltage applied to the anode of the at least one display pixel may be PVDD−Vdata1=PVDD−Vdata+$\Delta V$. When the at least one detection element is in the conductive state, the voltage drop $\Delta V$ on the at least one detection element may be small and Vdata1 may be large. Correspondingly, the voltage Vdata-Vdata1 applied to the anode of the at least one display pixel may be small and the brightness of the at least one display pixel may be low. When the at least one detection element is in the disconnection state, the voltage drop $\Delta V$ on the at least one detection element may be large and Vdata1 may be small. Correspondingly, the voltage Vdata-Vdata1 applied to the anode of the at least one display pixel may be large and the brightness of the at least one display pixel may be high.

In the present disclosure, the state of the at least one detection element may be determined by detecting the display brightness of the at least one display pixel connected to the at least one detection element. Specifically, when driving by the preset driving signal, when the display brightness of the at least one display pixel connected to the at least one detection element is larger than a preset brightness, it may be determined that the at least one detection element is in the disconnection state; otherwise, it may be determined that the at least one detection element is in the conductive state. The preset brightness may be a brightness of one of the plurality of display pixels adjacent to the at least one detection element when the at least one detection element is in the conductive state, driving by the preset driving signal.

In one embodiment, since the resistance of the at least one detection element may be small in the conductive state, the state of the at least one detection element may be determined by detecting the display brightness of the at least one display pixel connected to the at least one detection element and other display pixels of the plurality of display pixels. When the display brightness of the at least one display pixel connected to the at least one detection element is larger than the display brightness of the other display pixels, and a difference between the display brightness of the at least one display pixel connected to the at least one detection element and the display brightness of the other display pixels is larger than a preset range, it may be determined that the at least one detection element is in the disconnection state. When the difference between the display brightness of the at least one display pixel connected to the at least one detection element and the display brightness of the other display pixels is in the preset range, it may be determined that the at least one detection element is in the conductive state.

Figure 22:
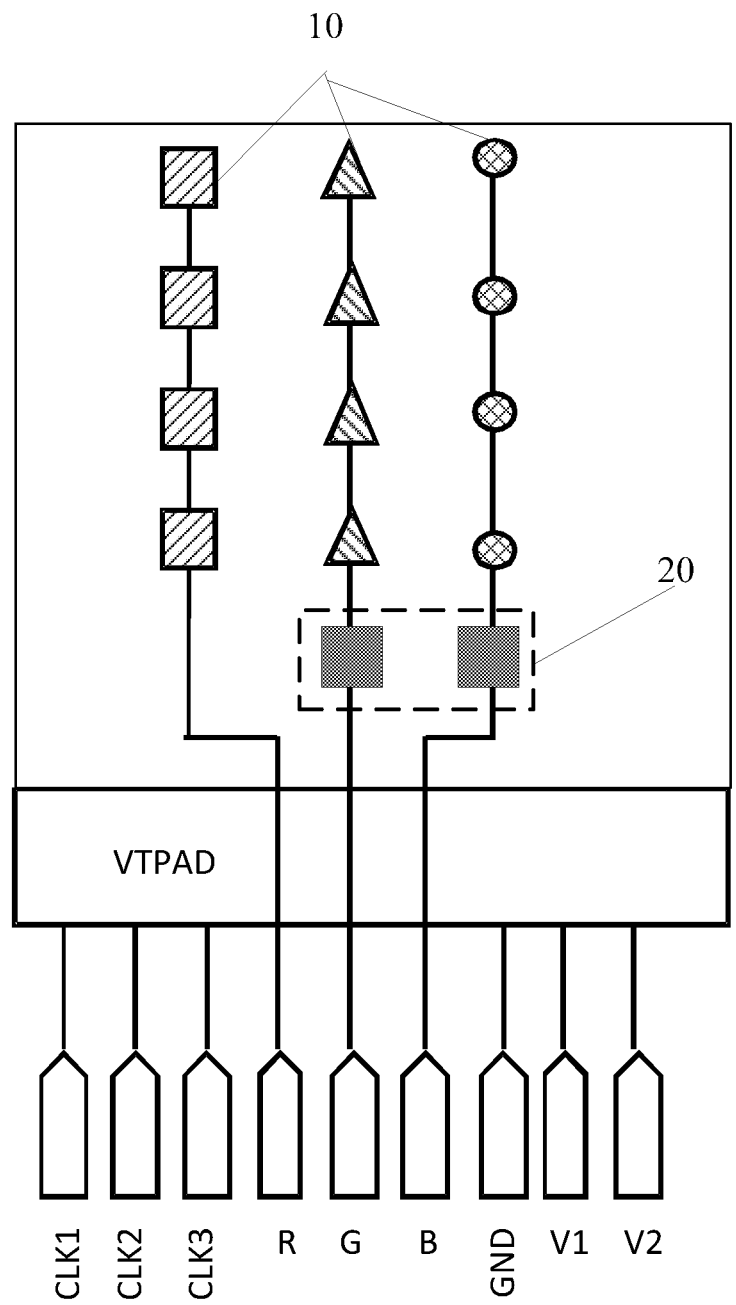
FIG. 22 illustrates a simplified view of another exemplary array substrate when an aging process is performed on a plurality of pixels consistent with various disclosed embodiments in the present disclosure.

In one embodiment illustrated in FIG. 22, the at least one detection element 20 may be connected in lines of the at least one display pixel in series. When performing the aging process on the plurality of display pixels 10, the high voltage may be applied to the R, G, B, and U terminals of the detection soldering pad VTPAD. After the aging process on the plurality of display pixels 10 is completed, the at least one detection element 20 may change to the conductive state. Correspondingly, after removing the detection soldering pad, the driving signal may be provided to the at least one display pixel. Then, when the display brightness of the at least one display pixel 10 connected to the at least one detection element is too high, it may be determined that the at least one detection element is in the disconnection state and the plurality of display pixels 10 has not undergone the aging process. When the display brightness of the at least one display pixel 10 connected to the at least one detection element is not too high (that is, normal), it may be determined that the at least one detection element is in the conductive state and the plurality of display pixels 10 has undergone the aging process.

That the display brightness of the at least one display pixel is too high may be that the display brightness of the at least one display pixel is larger than a preset brightness or may be that the difference between the display brightness of the at least one display pixel and the brightness of other display pixels does not exceed the present range. The present disclosure has no limit on this and it can be configured according to actual needs.

In the present disclosure, whether the plurality of display pixels has undergone the aging process may be determined based on the display state of the at least one display pixel connected to the at least one detection element. Specifically, when the second signal connection terminal inputs the low voltage Vdata, it may be determined that the plurality of display pixels has undergone the aging process when the display brightness of the at least one display pixel connected to the at least one detection element is normal, and it may be determined that the plurality of display pixels has not undergone the aging process when the display brightness of the at least one display pixel connected to the at least one detection element is too bright. The process for determining whether the plurality of display pixels has undergone the aging process may be more intuitive.

An anti-fuse may have the opposite physical characteristics of a fuse, that is, the anti-fuse may have a large impedance ($>10^9 \Omega$) before applying a voltage to show an disconnected circuit state, and may have a smaller resistance (about $20\Omega$ to about $50\Omega$) after applying a voltage to show a conductive state. Therefore, in one embodiment based on any one of the previous embodiments, the at least one detection element 20 may be an anti-fuse element, as shown in FIG. 21, such that the first state of the at least one detection element 20 is the disconnection state and the second state is the conductive state when a voltage is applied between the first terminal and the second terminal of the at least one detection element 20. Since the specific structure of the anti-fuse element is well known to those skilled in the art, this disclosure will not repeat it.

Figure 23:
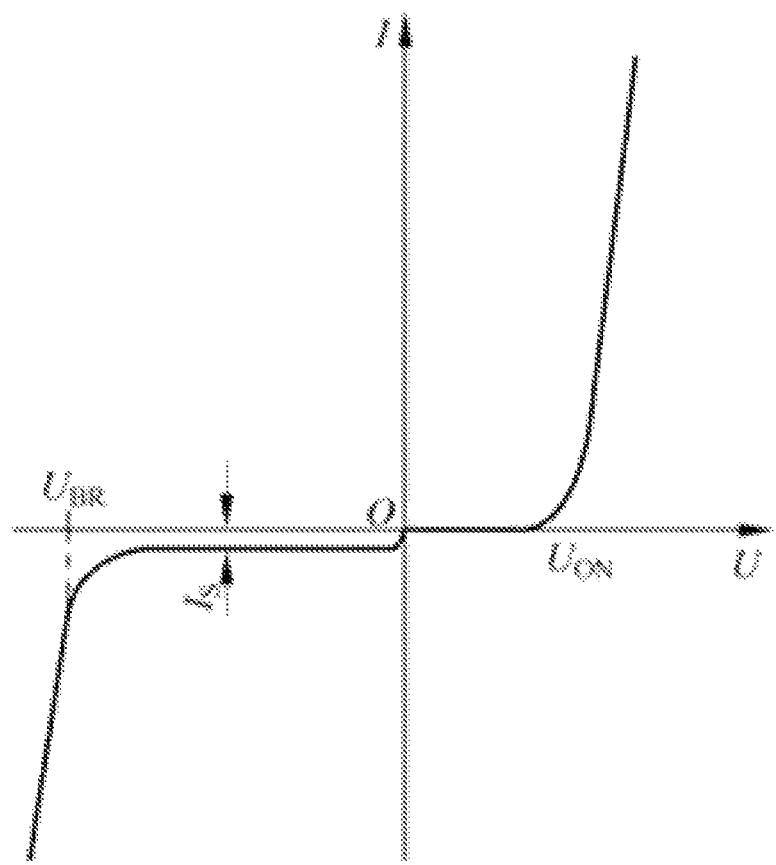
FIG. 23 illustrates a curve of a current with an applied voltage of a unidirectional diode consistent with various disclosed embodiments in the present disclosure.
Figure 24:
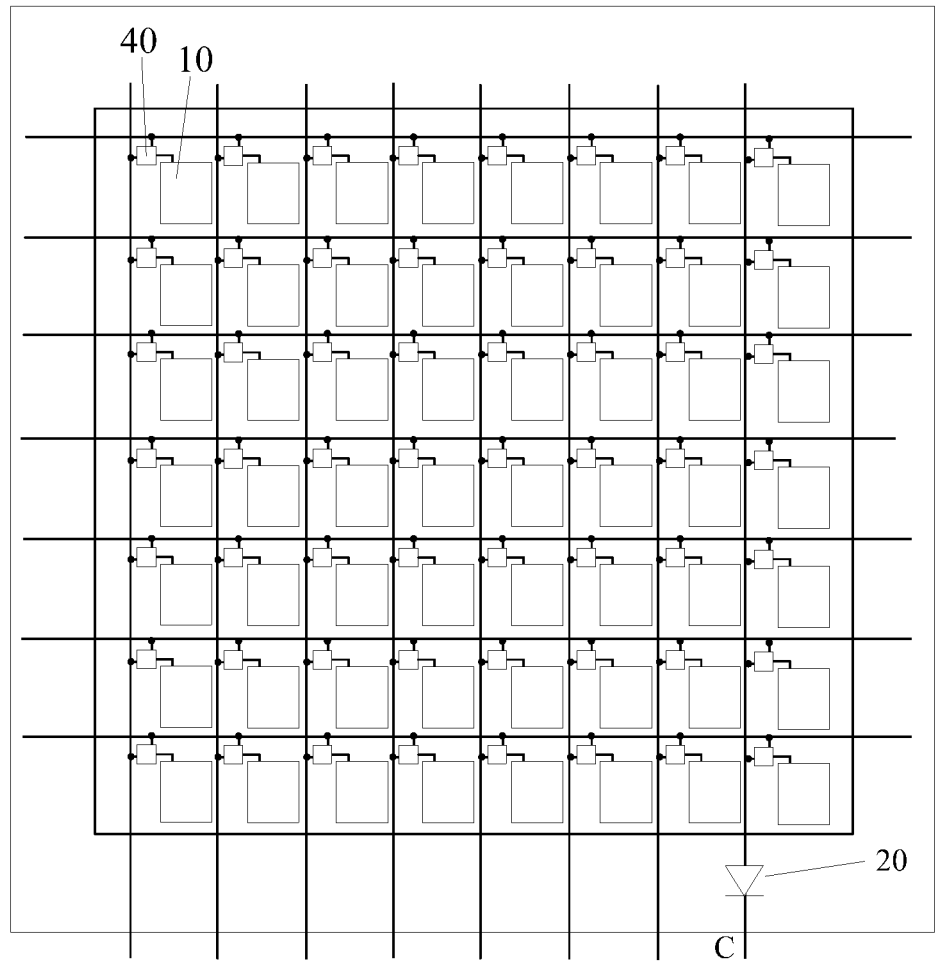
FIG. 24 illustrates another exemplary array substrate consistent with various disclosed embodiments in the present disclosure.

A unidirectional conduction diode may have a unidirectional conduction function before breakdown, and may have a dual conduction function after breakdown, as shown in FIG. 23 showing the schematic diagram of the current of a unidirectional conduction diode under different voltages. As illustrated in FIG. 23, when a forward voltage is applied to the unidirectional conduction diode and the voltage is greater than the forward conducting voltage $U_{ON}$ of the unidirectional conduction diode, the unidirectional conduction diode may conduct. When a reverse voltage is applied to the unidirectional conduction diode and the reverse voltage is less than the breakdown voltage $U_{BR}$ of the unidirectional conduction diode, the current in the unidirectional conduction diode may be basically zero and the unidirectional conduction diode may be in an disconnection state. When the reverse voltage is larger than the breakdown voltage of the unidirectional conduction diode $U_{BR}$, the current in the unidirectional conduction diode may increase instantaneously, and the unidirectional conduction diode may be turned on and can be used as a wire. Therefore, in one embodiment, the at least one detection element 20 may also be a unidirectional conduction diode, as shown in FIG. 24, such that that the first state of the at least one detection element 20 is the disconnection state and the second state is the conductive state when a voltage is applied between the first terminal and the second terminal of the at least one detection element 20. The present embodiment is used as an example to illustrate the present disclosure only and should not limit the scope of the present disclosure. The different states of the at least one detection element can be configured according to actual needs.

In one embodiment, as illustrated in FIG. 24, the at least one detection element 20 may be a unidirectional conduction diode. A negative terminal of the unidirectional conduction diode may be connected to the second signal connection terminal C, and a positive terminal of the unidirectional conduction diode may be connected to the at least one display pixel 10, such that whether the plurality of display pixels has undergone the aging process may be determined based on the display state of the at least one display pixel connected to the at least one detection element.

Figure 25:
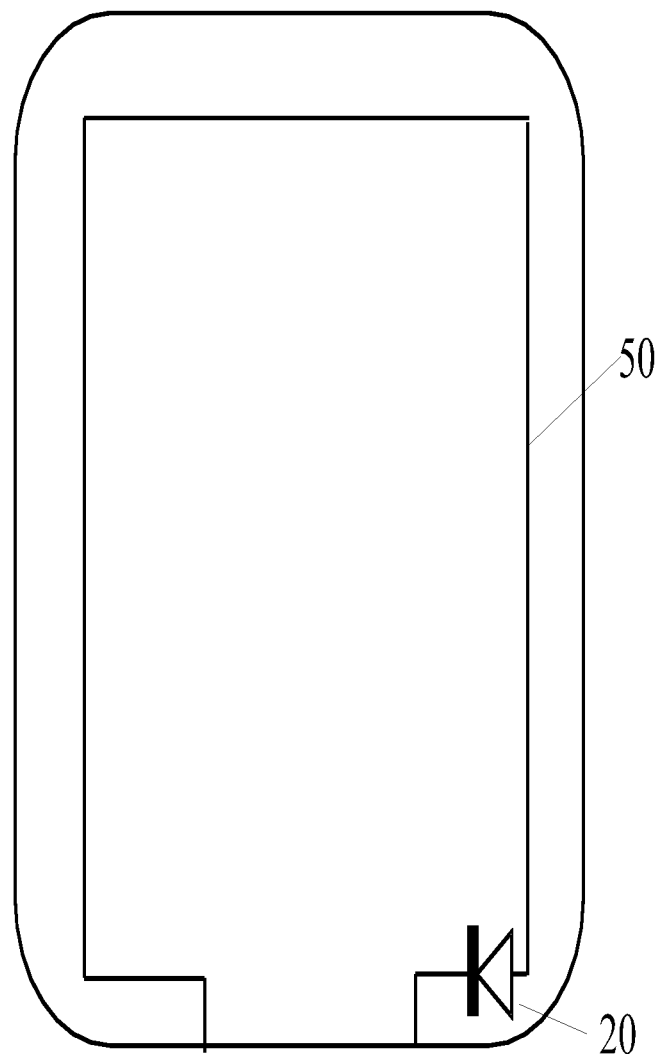
FIG. 25 illustrates another exemplary array substrate consistent with various disclosed embodiments in the present disclosure.

In one embodiment, the at least one detection element 20 may be a unidirectional conduction diode and may be connected in series to the at least one display pixel. In some other embodiments, the at least one detection element 20 may be a unidirectional conduction diode and may be connected in series to a crack detection line 50 of the array substrate, as illustrated in FIG. 25. The crack detection line 50 may be configured to detect whether there are cracks in the array substrate after the fabrication of the array substrate is completed. In some embodiments, the crack detection line 50 may be a PCB line. In some other embodiments, the crack detection line 50 may be any suitable line and can be configured according to actual needs. The present disclosure has no limit on this.

For description purposes only, the embodiment where the at least one detection element 20 is connected in series to a crack detection line 50 of the array substrate will be used as an example to illustrate the present disclosure and should not limit the scopes of the present disclosure.

A unidirectional conduction diode may have a unidirectional conduction function before breakdown, and may have a dual conduction function after breakdown. In the present disclosure, the unidirectional conduction diode may be connected in series to the crack detection line 50 of the array substrate. Correspondingly, when the crack detection line is unidirectional conduction, it may be determined that the at least one detection element is in the first state and the plurality of display pixels has not undergone the aging process. When the crack detection line is dual conduction, it may be determined that the at least one detection element is in the second state and the plurality of display pixels has undergone the aging process. When the crack detection line is in the disconnection state, it may be determined that there are cracks in the array substrate.

Figure 26:
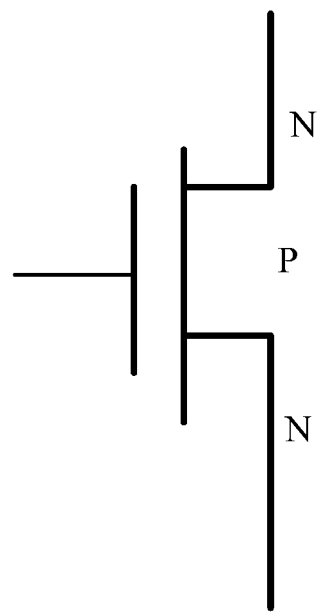
FIG. 26 illustrates an exemplary thin film transistor consistent with various disclosed embodiments in the present disclosure.
Figure 27:
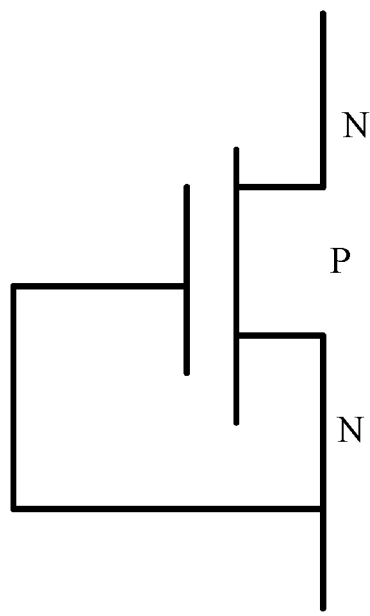
FIG. 27 illustrates an exemplary unidirectional diode consistent with various disclosed embodiments in the present disclosure.
Figure 28:
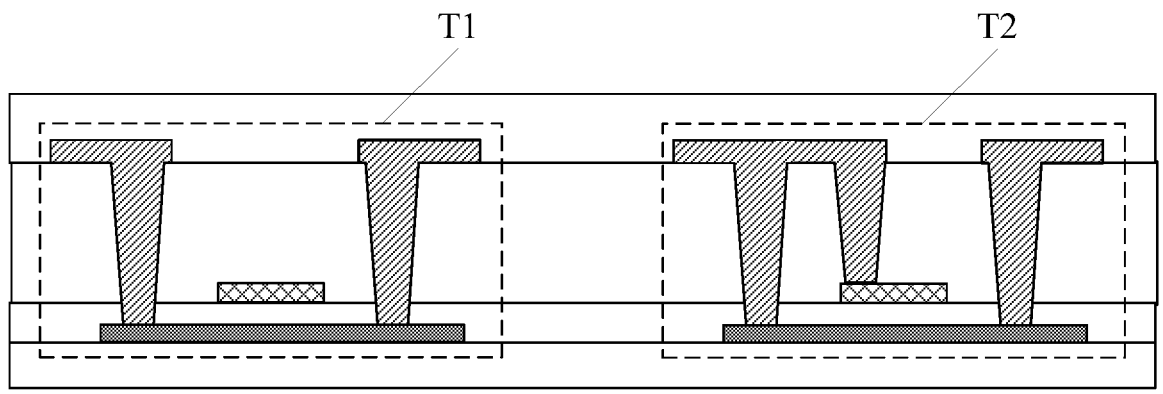
FIG. 28 illustrates a cross-section view of an exemplary thin film transistor and a unidirectional diode consistent with various disclosed embodiments in the present disclosure.

As illustrated in FIG. 26 illustrating the thin film transistor, FIG. 27 illustrating the unidirectional conduction diode, and FIG. 28 illustrating cross-section views of the thin film transistor T1 and the unidirectional conduction diode T2, fabrication processes of the thin film transistor and the unidirectional conduction diode may be compatible with each other. Correspondingly, in some embodiments, the array substrate may further include the pixel driving circuit including the thin film transistors for controlling the display state of the plurality of display pixels, and the at least one detection element may be the unidirectional conduction diode. The unidirectional conduction diode and the thin film transistor may be formed simultaneously, to simplify the fabrication process of the array substrate. For description purposes only, the embodiment is used as an example to illustrate the present disclosure and should not limit the scopes of the present disclosure. The fabrication of the unidirectional conduction diode and the thin film transistor may be configured according to actual needs.

Figure 29:
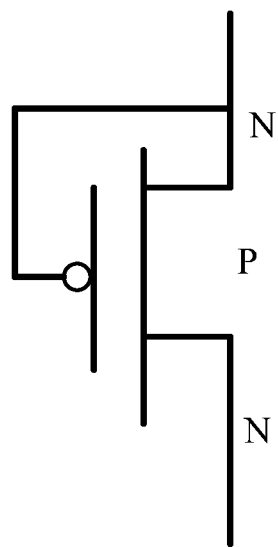
FIG. 29 illustrates another exemplary unidirectional diode consistent with various disclosed embodiments in the present disclosure.

In one embodiment illustrated in FIG. 26, the unidirectional conduction diode may be an N-type unidirectional conduction diode. In other embodiments illustrated in FIG. 29, the unidirectional conduction diode may be a P-type unidirectional conduction diode. The present disclosure has no limit on this. The type of the unidirectional conduction diode may be configured according to actual needs.

Figure 30:
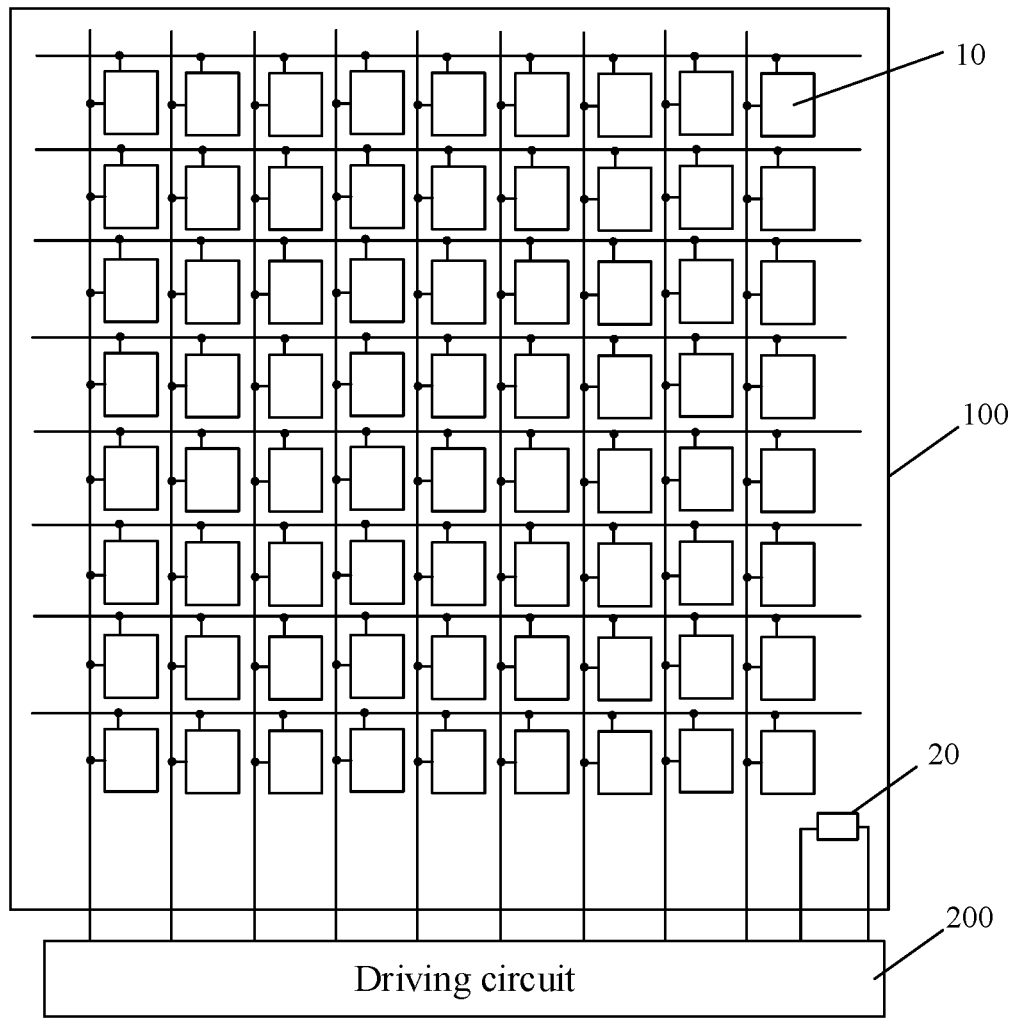
FIG. 30 illustrates an exemplary display panel consistent with various disclosed embodiments in the present disclosure.

The present disclosure also provides a display panel. As illustrated in FIG. 30, in one embodiment, the display panel may include an array substrate 100 provided by previous embodiments and a driving circuit 200. The driving circuit 200 may be electrically connected to signal connection terminals of the array substrate 100 for providing driving signals to a plurality of display pixels 10 and at least one detection element 20 of the array substrate 100. In the present disclosure, when the driving circuit 200 provides driving signals to the at least one detection element 20, it may be determined that the plurality of display pixels 10 has not undergone the aging process when the at least one detection element 20 is in the first state and the plurality of display pixels 10 has undergone the aging process when the at least one detection element 20 is in the second state.

In one embodiment, when the aging process is performed on the plurality of display pixels, a first driving signal may be applied on the at least one detection element. Correspondingly, when the plurality of display pixels 10 has undergone the aging process, the first driving signal may have been applied on the at least one detection element, and the at least one detection element may change from the first state to the second state. Therefore, when the driving circuit provides the driving signal to the at least one detection element, whether the plurality of display pixels has undergone the aging process may be determined based on the state of the at least one detection element. Specifically, it may be determined that the plurality of display pixels 10 has not undergone the aging process when the at least one detection element 20 is in the first state and the plurality of display pixels 10 has undergone the aging process when the at least one detection element 20 is in the second state.

In one embodiment, as illustrated in FIG. 30, the first terminal of the at least one detection element 20 may be connected to the first signal connection terminal of the array substrate 100, and the second terminal of the at least one detection element 20 may be connected to the third signal connection terminal of the array substrate 100. In the present embodiment, the driving circuit 200 may provide the driving signal to the at least one detection element 20 through the first signal connection terminal and the third signal connection terminal of the array substrate 100, to facilitate the determination of whether the plurality of display pixels has undergone the aging process based on the state of the at least one detection element 20.

Figure 31:
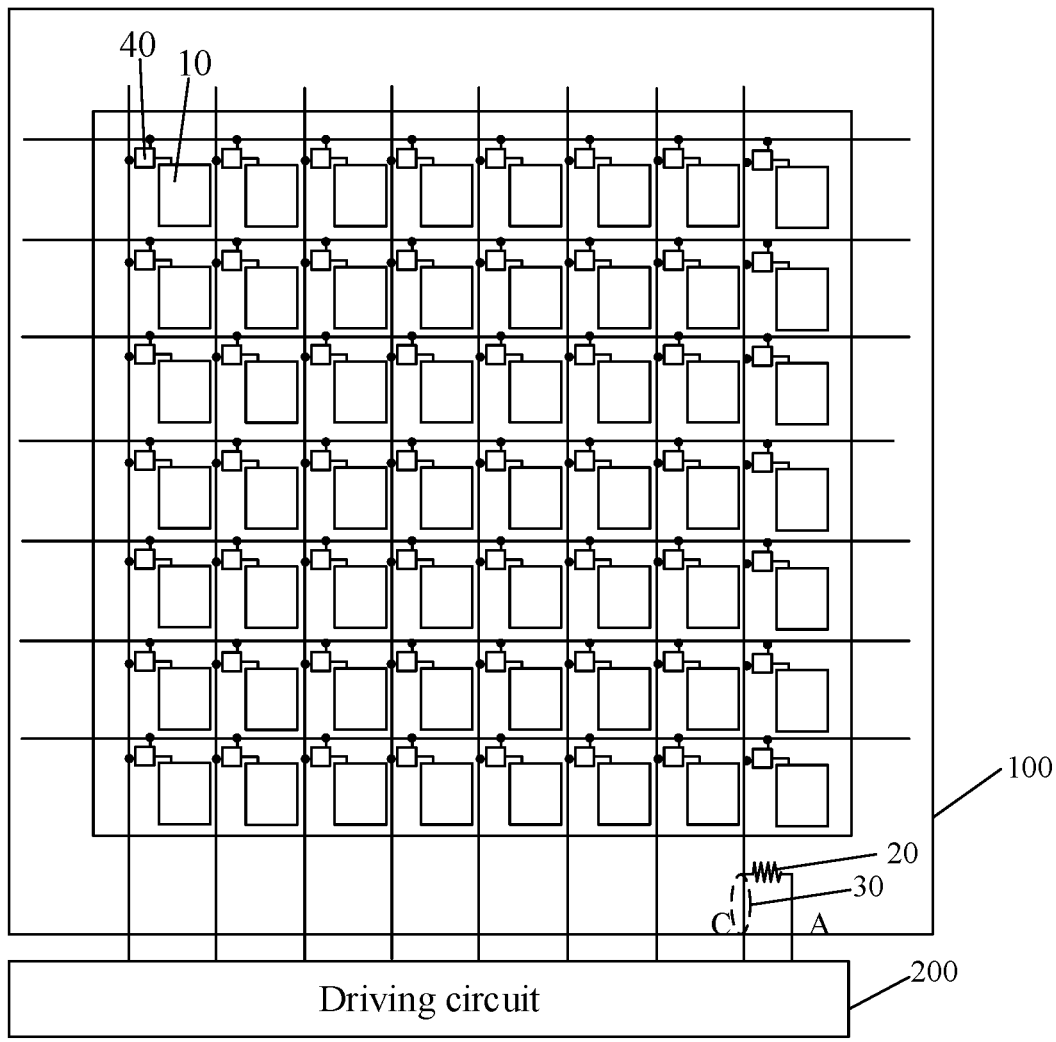
FIG. 31 illustrates another exemplary display panel consistent with various disclosed embodiments in the present disclosure.

In one embodiment, when the voltage is applied between the first terminal and the second terminal of the at least one detection element 20, the first state of the at least one detection element 20 may be the conductive state, and the second state may be the disconnection state. As illustrated in FIG. 31, the first terminal of the at least one detection element 20 may be connected to the first signal connection terminal A of the array substrate 100, and the second terminal of the at least one detection element 20 may be connected to at least one display pixel 10 of the plurality of display pixels 10. The at least one detection element 20 may be connected in parallel to a preset conductive path 30. One terminal of the preset conductive path 30 may be connected to the second signal connection terminal C of the array substrate 100, and another terminal of the preset conductive path 30 may be connected to the at least one display pixel 10. When the driving circuit 200 provides the driving signal to the at least one detection element 20, it may be determined that the at least one detection element 20 may be in the first state and the plurality of display pixels 10 has not undergone the aging process when the at least one display pixel 10 is in a third state. Further, it may be determined that the at least one detection element 20 may be in the second state and the plurality of display pixels 10 has undergone the aging process when the at least one display pixel 10 is in a fourth state. The third state may be different from the fourth state.

In the present disclosure, when the second signal connection terminal of the array substrate inputs a low voltage Vdata and the first signal connection terminal of the array substrate inputs a high voltage VGH, if the at least one detection element is in the disconnection state, the high voltage input through the first signal connection terminal may not be transmitted through the at least one detection element to the at least one display pixel electrically connected to the at least one detection element. The voltage applied to the anode of the at least one display pixel may be PVDD−Vdata. Correspondingly, the voltage difference between the anode and the cathode of the at least one display pixel may be large, and the at least one display pixel that is electrically connected to the at least one detection element may be in a lighted state, If the at least one detection element is in the conductive state, the high voltage input through the first signal connection terminal may be transmitted through the at least one detection element to the at least one display pixel electrically connected to at least one the detection element. At this time, the voltage applied to the anode of the at least one display pixel is PVDD−VGH, and the voltage difference between the anode and the cathode of the at least one display pixel may be small. Correspondingly, the at least one display pixel electrically connected to the at least one detection element may be in an off state.

Correspondingly, in one embodiment, the third state may be the off state and the fourth state may be the lighted state. Specifically, when the second signal connection terminal of the array substrate inputs the low voltage and the first signal connection terminal of the array substrate inputs the high voltage, it may be determined that the plurality of display pixels 10 has undergone the aging process when the at least one display pixel electrically connected to the at least one detection element is in the lighted state, and it may be determined that the plurality of display pixels 10 has not undergone the aging process when the at least one display pixel electrically connected to the at least one detection element is in the off state. The process for determining whether the plurality of display pixels 10 has undergone the aging process may be more intuitive.

Correspondingly, in one embodiment, the high voltage may be applied to the first signal connection terminal and the voltage on the second signal connection terminal may be detected, to determine the state of the at least one detection element. When the voltage on the second signal connection terminal is a high voltage, the at least one detection element may be determined to be in the conductive state (the first state). When the voltage on the second the at least one detection element is the low voltage, the at least one detection element may be determined to be in the disconnection state (the second state).

In the display panel provided by the present disclosure, the voltage on the second signal connection terminal may be detected when the high voltage is applied to the first signal connection terminal, to determine whether the plurality of display pixels has undergone the aging process. The second signal connection terminal of the array substrate may input the low voltage and the first signal connection terminal of the array substrate may input the high voltage. Correspondingly, when the voltage on the second the at least one detection element is the low voltage, it may be determined that the plurality of display pixels has undergone the aging process; and when the voltage on the second signal connection terminal is the high voltage, it may be determined that the plurality of display pixels has not undergone the aging process. The determination of whether the plurality of display pixels has undergone the aging process may be quicker.

For description purposes only, the previous embodiments where the first state of the at least one detection element is the conductive state and the second state is the disconnection state are used as examples to illustrate the present disclosure, and should not limit the scopes of the present disclosure. For example, in other embodiments, when the voltage is applied between the first terminal and the second terminal of the at least one detection element, the first state of the at least one detection element may be the disconnection state and the second state may be the conductive state.

One embodiment where the first state of the at least one detection element is the disconnection state and the second state is the conductive state when the voltage is applied between the first terminal and the second terminal of the at least one detection element will be used as an example to illustrate the process for determining whether the plurality of display pixels has undergone the aging process by detecting the state of the at least one display pixel.

Figure 32:
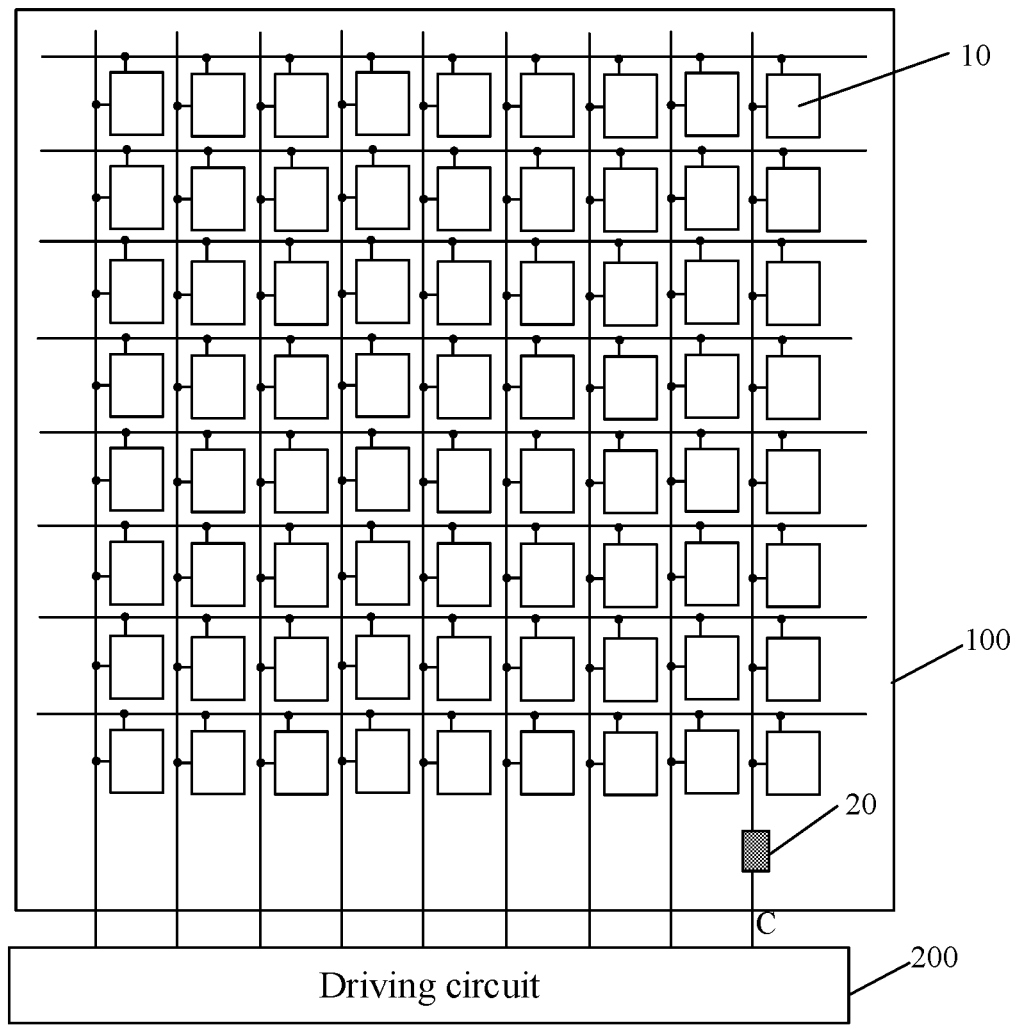
FIG. 32 illustrates another exemplary display panel consistent with various disclosed embodiments in the present disclosure.

In one embodiment, when the voltage is applied between the first terminal and the second terminal of the at least one detection element, the first state of the at least one detection element may be the disconnection state and the second state may be the conductive state. As illustrated in FIG. 32, the at least one detection element 20 may be connected in series to at least one display pixel 10 of the plurality of display pixels 10. One terminal of the at least one detection element 20 may be connected to the first signal connection terminal of the array substrate 100 and another terminal may be connected to the at least one display pixel 10. In one embodiment, the driving circuit may provide the driving signal to the at least one detection element. When the at least one display pixel is in the fourth state, it may be determined that the at least one detection element is in the second state and the plurality of display pixels has undergone the aging process. When the at least one display pixel is in the third state, it may be determined that the at least one detection element is in the first state and the plurality of display pixels has not undergone the aging process.

In one embodiment, under the same driving signal, the brightness of the at least one display pixel in the third state may be larger than the brightness of the at least one display pixel in the fourth state.

In one embodiment, when the driving circuit provides the driving signal to the at least one detection element, the state of the at least one detection element may be determined based on the display brightness of the at least one display pixel connected to the at least one detection element. Specifically, under a preset driving signal, when the display brightness of the at least one display pixel connected to the at least one detection element is larger than a preset brightness, it may be determined that the at least one detection element is in the disconnection state; otherwise, it may be determined that the at least one detection element is in the conductive state. The preset brightness may be a display brightness of display pixels of the plurality of display pixels adjacent to the at least one detection element under the preset driving signal when the at least one detection element is in the conductive state.

In some other embodiments, the state of the at least one detection element may be determined by detecting the display brightness of the at least one display pixel connected to the at least one detection element and other display pixels of the plurality of display pixels. When the display brightness of the at least one display pixel connected to the at least one detection element is larger than the display brightness of the other display pixels and a difference between the display brightness of the at least one display pixel connected to the at least one detection element and the display brightness of the other display pixels is larger than a preset range, it may be determined that the at least one detection element is in the disconnection state. When the difference between the display brightness of the at least one display pixel connected to the at least one detection element and the display brightness of the other display pixels is in the preset range, it may be determined that the at least one detection element is in the conductive state.

In the present disclosure, whether the plurality of display pixels has undergone the aging process may be determined based on the display state of the at least one display pixel connected to the at least one detection element. Specifically, when the second signal connection terminal inputs the low voltage Vdata, it may be determined that the plurality of display pixels has undergone the aging process when the display brightness of the at least one display pixel connected to the at least one detection element is normal, and it may be determined that the plurality of display pixels has not undergone the aging process when the display brightness of the at least one display pixel connected to the at least one detection element is too bright. The process for determining whether the plurality of display pixels has undergone the aging process may be more intuitive.

In one embodiment, the at least one detection element may be an anti-fuse element or a unidirectional conduction diode, such that the first state of the at least one detection element is the disconnection state and the second state is the conductive state when the voltage is applied between the first terminal and the second terminal of the at least one detection element. The embodiment is used as an example to illustrate the present disclosure and should not limit the scopes of the present disclosure. The structure of the at least one detection element may be configured according to actual needs.

In one embodiment, the at least one detection element may be a unidirectional conduction diode. A negative terminal of the unidirectional conduction diode may be connected to the second signal connection terminal, and a positive terminal of the unidirectional conduction diode may be connected to the at least one display pixel, such that whether the plurality of display pixels has undergone the aging process may be determined based on the display state of the at least one display pixel connected to the at least one detection element.

In one embodiment, the at least one detection element may be a unidirectional conduction diode and may be connected in series to the at least one display pixel. In some other embodiments, the at least one detection element may be a unidirectional conduction diode and some other methods may be used to determine whether the plurality of display pixels has undergone the aging process.

Figure 33:
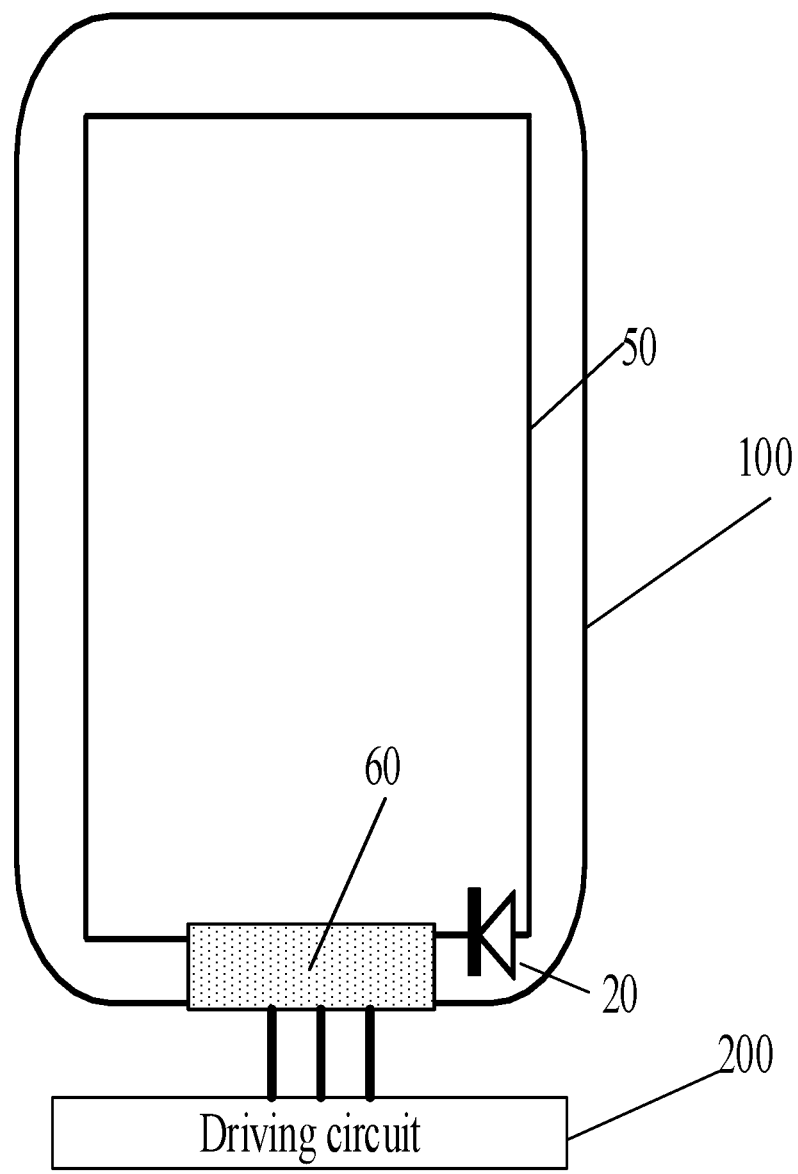
FIG. 33 illustrates another exemplary display panel consistent with various disclosed embodiments in the present disclosure.

In one embodiment as illustrated in FIG. 33, the at least one detection element 20 may be a unidirectional conduction diode and may be connected in series to a crack detection line 50 of the array substrate. A unidirectional conduction diode may have a unidirectional conduction function before breakdown, and may have a dual conduction function after breakdown. In the present disclosure, the unidirectional conduction diode may be connected in series to the crack detection line 50 of the array substrate. Correspondingly, when the crack detection line is unidirectional conduction, it may be determined that the at least one detection element is in the first state and the plurality of display pixels has not undergone the aging process. When the crack detection line is dual conduction, it may be determined that the at least one detection element is in the second state and the plurality of display pixels has undergone the aging process. When the crack detection line is in the disconnection state, it may be determined that there are cracks in the array substrate.

In one embodiment as illustrated in FIG. 33, the crack detection line 50 may be connected to the driving circuit 200 through a gold finger 60. The embodiment illustrated in FIG. 33 is used as an example to illustrate the present disclosure and should not limit the scopes of the present disclosure. The structure of the crack detection line may be configured according to actual needs.

The present disclosure also provides a detection method. The detection method may be applied to any display panel provided by previous embodiments of the present disclosure. In one embodiment, the detection method may include: providing a second driving signal to the at least one detection element; determining that the plurality of display pixels has not undergone the aging process when the at least one detection element is in the first state; and determining that the plurality of display pixels has undergone the aging process when the at least one detection element is in the second state.

In the present disclosure, when the plurality of display pixels is undergoing the aging process, the first driving signal may be applied to the at least one detection element. When the plurality of display pixels has undergone the aging process, the first driving signal may have been applied to the at least one detection element and correspondingly the at least one detection element may change from the first state to the second state. Correspondingly, whether the plurality of display pixels has undergone the aging process may be determined by detecting the state of the at least one detection element when the second driving signal is applied to the at least one detection element. Specifically, when the at least one detection element is in the first state, it may be determined that the plurality of display pixels has not undergone the aging process. When the at least one detection element is in the second state, it may be determined that the plurality of display pixels has undergone the aging process.

In one embodiment, the first terminal of the at least one detection element may be connected to the first signal connection terminal of the array substrate, and the second terminal of the at least one detection terminal may be connected to the third signal connection terminal of the array substrate. Correspondingly, providing the second driving signal to the at least one detection element may include: providing the second driving signal to the at least one detection element through the first signal connection terminal of the array substrate and the third signal connection terminal of the array substrate, to facilitate the determination of whether the plurality of display pixels has undergone the aging process based on the state of the at least one detection element.

In one embodiment, when the voltage is applied between the first terminal and the second terminal of the at least one detection element 20, the first state of the at least one detection element 20 may be the conductive state, and the second state may be the disconnection state. The first terminal of the at least one detection element 20 may be connected to the first signal connection terminal A of the array substrate 100, and the second terminal of the at least one detection element 20 may be connected to at least one display pixel 10 of the plurality of display pixels 10. The at least one detection element 20 may be connected in parallel to a preset conductive path 30. One terminal of the preset conductive path 30 may be connected to the second signal connection terminal C of the array substrate 100, and another terminal of the preset conductive path 30 may be connected to the at least one display pixel 10.

Correspondingly, the method may further include: when the second driving signal is provided to the at least one detection element, determining the state of the at least one detection element based on the display state of the at least one display pixel. It may be determined that the at least one detection element may be in the first when the at least one display pixel is in the third state, and it may be determined that the at least one detection element may be in the second state when the at least one display pixel is in a fourth state. The third state may be different from the fourth state.

In one embodiment, the third state may be the off state and the fourth state may be the lighted state. Correspondingly, determining the state of the at least one detection element based on the display state of the at least one display pixel when the second driving signal is provided to the at least one detection element may include: inputting the low voltage to the second signal connection terminal of the array substrate and the high voltage to the first signal connection terminal of the array substrate; determining that the at least one detection element is in the second state and the plurality of display pixels has undergone the aging process when the at least one display pixel electrically connected to the at least one detection element is in the lighted state; and determining that the at least one detection element is in the first state and the plurality of display pixels has not undergone the aging process when the at least one display pixel electrically connected to the at least one detection element is in the off state. The process for determining whether the plurality of display pixels 10 has undergone the aging process may be more intuitive.

In some embodiments, the method may further include: applying the high voltage to the first signal connection terminal; and detecting the voltage on the second signal connection terminal to determine the state of the at least one detection element. When the voltage on the second signal connection terminal is a high voltage, the at least one detection element may be determined to be in the conductive state (the first state). When the voltage on the second the at least one detection element is the low voltage, the at least one detection element may be determined to be in the disconnection state (the second state).

In the display panel provided by the present disclosure, the voltage on the second signal connection terminal may be detected when the high voltage is applied to the first signal connection terminal, to determine whether the plurality of display pixels has undergone the aging process. The second signal connection terminal of the array substrate may input the low voltage and the first signal connection terminal of the array substrate may input the high voltage. Correspondingly, when the voltage on the second the at least one detection element is the low voltage, it may be determined that the plurality of display pixels has undergone the aging process; and when the voltage on the second signal connection terminal is the high voltage, it may be determined that the plurality of display pixels has not undergone the aging process. The determination of whether the plurality of display pixels has undergone the aging process may be quicker.

For description purposes only, the previous embodiments where the first state of the at least one detection element is the conductive state and the second state is the disconnection state are used as examples to illustrate the present disclosure, and should not limit the scopes of the present disclosure. For example, in other embodiments, when the voltage is applied between the first terminal and the second terminal of the at least one detection element, the first state of the at least one detection element may be the disconnection state and the second state may be the conductive state.

One embodiment where the first state of the at least one detection element is the disconnection state and the second state is the conductive state when the voltage is applied between the first terminal and the second terminal of the at least one detection element will be used as an example to illustrate the process for determining whether the plurality of display pixels has undergone the aging process by detecting the state of the at least one display pixel.

In one embodiment, when the voltage is applied between the first terminal and the second terminal of the at least one detection element, the first state of the at least one detection element may be the disconnection state and the second state may be the conductive state. The at least one detection element may be connected in series to at least one display pixel of the plurality of display pixels. One terminal of the at least one detection element may be connected to the first signal connection terminal of the array substrate and another terminal may be connected to the at least one display pixel. Correspondingly, the detection method may further include: when the driving circuit may provide the second driving signal to the at least one detection element, determining the state of the at least one detection element based on the display state of the at least one display pixel. When the at least one display pixel is in the fourth state, it may be determined that the at least one detection element is in the second state and the plurality of display pixels has undergone the aging process. When the at least one display pixel is in the third state, it may be determined that the at least one detection element is in the first state and the plurality of display pixels has not undergone the aging process. The third state may be different from the fourth state.

In one embodiment, under the same driving signal, the brightness of the at least one display pixel in the third state may be larger than the brightness of the at least one display pixel in the fourth state.

In one embodiment illustrated, the at least one detection element may be connected to the at least one display pixel in series. When the at least one detection element is in the disconnection state, the signal from the second signal connection terminal cannot be transmitted to the at least one display pixel. When the at least one detection element is in the conductive state, the signal from the second signal connection terminal can be transmitted to the at least one display pixel. Correspondingly, in the present embodiment, the state of the at least one detection element may be determined by detecting the display status of the at least one display pixel connected to the at least one detection element in series, to determine whether the plurality of display pixels has undergone the aging process.

Correspondingly, in one embodiment, when the second driving signal is provided to the at least one detection element, determining the state of the at least one detection element based on the display state of the at least one display pixel may include: when the second driving signal is provided to the at least one detection element, determining the state of the at least one detection element based on the display brightness of the at least one display pixel connected to the at least one detection element. Specifically, under a preset driving signal, when the display brightness of the at least one display pixel connected to the at least one detection element is larger than a preset brightness, it may be determined that the at least one detection element is in the disconnection state; otherwise, it may be determined that the at least one detection element is in the conductive state. The preset brightness may be a display brightness of display pixels of the plurality of display pixels adjacent to the at least one detection element under the preset driving signal when the at least one detection element is in the conductive state.

In some other embodiments, when the second driving signal is provided to the at least one detection element, determining the state of the at least one detection element based on the display state of the at least one display pixel may include: when the second driving signal is provided to the at least one detection element, determining the state of the at least one detection element by detecting the display brightness of the at least one display pixel connected to the at least one detection element and other display pixels of the plurality of display pixels. When the display brightness of the at least one display pixel connected to the at least one detection element is larger than the display brightness of the other display pixels and a difference between the display brightness of the at least one display pixel connected to the at least one detection element and the display brightness of the other display pixels is larger than a preset range, it may be determined that the at least one detection element is in the disconnection state. When the difference between the display brightness of the at least one display pixel connected to the at least one detection element and the display brightness of the other display pixels is in the preset range, it may be determined that the at least one detection element is in the conductive state.

In the present disclosure, whether the plurality of display pixels has undergone the aging process may be determined based on the display state of the at least one display pixel connected to the at least one detection element. Specifically, when the second signal connection terminal inputs the low voltage Vdata, it may be determined that the plurality of display pixels has undergone the aging process when the display brightness of the at least one display pixel connected to the at least one detection element is normal, and it may be determined that the plurality of display pixels has not undergone the aging process when the display brightness of the at least one display pixel connected to the at least one detection element is too bright. The process for determining whether the plurality of display pixels has undergone the aging process may be more intuitive.

In one embodiment, the at least one detection element may be an anti-fuse element or a unidirectional conduction diode, such that the first state of the at least one detection element is the disconnection state and the second state is the conductive state when the voltage is applied between the first terminal and the second terminal of the at least one detection element. The embodiment is used as an example to illustrate the present disclosure and should not limit the scopes of the present disclosure. The structure of the at least one detection element may be configured according to actual needs.

In one embodiment, the at least one detection element may be a unidirectional conduction diode. A negative terminal of the unidirectional conduction diode may be connected to the second signal connection terminal, and a positive terminal of the unidirectional conduction diode may be connected to the at least one display pixel, such that whether the plurality of display pixels has undergone the aging process may be determined based on the display state of the at least one display pixel connected to the at least one detection element.

In one embodiment, the at least one detection element may be a unidirectional conduction diode and may be connected in series to the at least one display pixel. In some other embodiments, the at least one detection element may be a unidirectional conduction diode and some other methods may be used to determine whether the plurality of display pixels has undergone the aging process.

In one embodiment, the at least one detection element may be a unidirectional conduction diode and may be connected in series to a crack detection line of the array substrate. Correspondingly, the detection method may further include: when providing the second driving signal to the at least one detection element, determining the state of the at least one detection element based on the conductive state of the crack detection line. When the crack detection line is unidirectional conduction, it may be determined that the at least one detection element is in the first state and the plurality of display pixels has not undergone the aging process. When the crack detection line is dual conduction, it may be determined that the at least one detection element is in the second state and the plurality of display pixels has undergone the aging process.

A unidirectional conduction diode may have a unidirectional conduction function before breakdown, and may have a dual conduction function after breakdown. In the present disclosure, the unidirectional conduction diode may be connected in series to the crack detection line 50 of the array substrate. Correspondingly, when the crack detection line is unidirectional conduction, it may be determined that the at least one detection element is in the first state and the plurality of display pixels has not undergone the aging process. When the crack detection line is dual conduction, it may be determined that the at least one detection element is in the second state and the plurality of display pixels has undergone the aging process. When the crack detection line is in the disconnection state, it may be determined that there are cracks in the array substrate.

In the present disclosure, whether the plurality of display pixels has undergone the aging process may be determined based on the state of the at least one detection element in the array substrate. Problems of huge workload and easy missed detection caused by using the detection of bright and dark points to assist in determining whether the plurality of display pixels have undergone the aging process may be avoided.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. An array substrate, comprising a plurality of display pixels, at least one detection element, a first signal connection terminal of the array substrate, and a second signal connection terminal of the array substrate, wherein:
   the at least one detection element is connected in parallel with a preset conduction path and the preset conduction path is disposed between the second signal connection terminal of the array substrate and the at least one display pixel;
   when an aging process is performed on the plurality of display pixels, a first driving signal is applied on the at least one detection element and the at least one detection element changes from a first state to a second state, wherein the second state is different from the first state; and
   the second state of the at least one detection element indicates that the plurality of display pixels has undergone the aging process.

2. The array substrate according to claim 1, wherein:
   when a voltage is applied between a first terminal and a second terminal of the at least one detection element, the first state of the at least one detection element is a conduction state and the second state of the at least one detection element is a disconnection state.

3. The array substrate according to claim 2, wherein:
   the first terminal of the at least one detection element is connected to the first signal connection terminal of the array substrate, and the second terminal of the at least one detection element is connected to at least one display pixel of the plurality of display pixels;
   a terminal of the preset conduction path is connected to the second signal connection terminal of the array substrate; and
   another terminal of the preset conduction path is connected to the at least one display pixel.

4. The array substrate according to claim 2, wherein:
   the at least one detection element is a fuse element.

5. The array substrate according to claim 2, wherein:
   the first terminal of the at least one detection element is connected to a first signal connection terminal of the array substrate, and the second terminal of the at least one detection element is connected to a third signal connection terminal of the array substrate.

6. The array substrate according to claim 1, wherein:
when a voltage is applied between a first terminal and a second terminal of the at least one detection element, the first state of the at least one detection element is a disconnection state and the second state of the at least one detection element is a conduction state.

7. The array substrate according to claim 6, wherein:
the at least one detection element is connected in series with at least one display pixel of the plurality of display pixels;
a terminal of the at least one detection element is connected to a second signal connection terminal of the array substrate; and
another terminal of the at least one detection element is connected to the at least one display pixel.

8. The array substrate according to claim 6, wherein the at least one detection element is an anti-fuse element or a unidirectional conduction diode.

9. The array substrate according to claim 8, wherein:
the at least one detection element is a unidirectional conduction diode and is connected in series with a crack detection line of the array substrate.

10. The array substrate according to claim 8, further including pixel driving circuits, wherein:
each of the pixel driving circuits includes a thin film transistor for controlling a state of a corresponding display pixel of the plurality of display pixels.

11. The array substrate according to claim 10, wherein:
the at least one detection element is a unidirectional conduction diode; and
the at least one detection element and the thin film transistor are formed simultaneously.

12. The array substrate according to claim 6, wherein:
the first terminal of the at least one detection element is connected to a first signal connection terminal of the array substrate, and the second terminal of the at least one detection element is connected to a third signal connection terminal of the array substrate.

13. A display panel, comprising:
an array substrate including a plurality of display pixels and at least one detection element, wherein: when an aging process is performed on the plurality of display pixels, a first driving signal is applied on the at least one detection element and the at least one detection element changes from a first state to a second state, wherein the second state is different from the first state; and the second state of the at least one detection element indicates that the plurality of display pixels has undergone the aging process; and
a driving circuit, wherein:
the driving circuit is connected to a signal connection terminal of the array substrate for providing driving signals to the plurality of display pixels and the at least one detection element; and
when the driving circuit providing a driving signal to the at least one detection element, it is determined that the plurality of display pixels has undergone the aging process when the at least one detection element is in the second state, and it is determined the plurality of display pixels has not undergone the aging process when the at least one detection element is in the first state.

14. The display panel according to claim 13, wherein:
when a voltage is applied between a first terminal and a second terminal of the at least one detection element, the first state of the at least one detection element is a conduction state and the second state of the at least one detection element is a disconnection state;
the first terminal of the at least one detection element is connected to a first signal connection terminal of the array substrate, and the second terminal of the at least one detection element is connected to at least one display pixel of the plurality of display pixels;
the at least one detection element is connected in parallel with a preset conduction path;
the preset conduction path is disposed between a second signal connection terminal of the array substrate and the at least one display pixel;
a terminal of the preset conduction path is connected to the second signal connection terminal of the array substrate; and
another terminal of the preset conduction path is connected to the at least one display pixel;
when the driving circuit provides the driving signal to the at least one detection element, it is determined that the at least one detection element is in the first state and the plurality of display pixels has not undergone the aging process when the at least one display pixel is in a third state, and that the at least one detection element is in the second state and the plurality of display pixels has undergone the aging process when the at least one display pixel is in a fourth state; and
the fourth state is different from the third state.

15. The display panel according to claim 14, wherein:
the third state is an off state and the fourth state is a lighted state.

16. The display panel according to claim 13, wherein:
when a voltage is applied between a first terminal and a second terminal of the at least one detection element, the first state of the at least one detection element is a disconnection state and the second state of the at least one detection element is a conduction state;
the at least one detection element is connected in series with at least one display pixel of the plurality of display pixels;
a terminal of the at least one detection element is connected to a second signal connection terminal of the array substrate;
another terminal of the at least one detection element is connected to the at least one display pixel; and
when the driving circuit provides the driving signal to the at least one detection element,
if the at least one display pixel is in a fourth state, the at least one detection element is in the second state and the plurality of display pixels has undergone the aging process and
if the at least one display pixel is in a third state, the at least one detection element is in the first state and the plurality of display pixels has not undergone the aging process, the third state being different than the fourth state.

17. The display panel according to claim 16, wherein:
under a same driving signal, a brightness of the at least one display pixel in the third state is larger than a brightness of the at least one display pixel in the fourth state.

18. The display panel according to claim 13, wherein:
the at least one detection element is a unidirectional conduction diode and is connected in series with a crack detection line of the array substrate; and
when the crack detection line is in a unidirectional conduction state, it is determined that the at least one detection element is in the first state and the plurality of display pixels has not undergone the aging process; and when the crack detection line is in a dual directional conduction state, it is determined that the at least one detection element is in the second state and the plurality of display pixels has undergone the aging process.

19. A detection method, being applied to an array substrate including a plurality of display pixels, at least one detection element, a first signal connection terminal of the array substrate, and a second signal connection terminal of the array substrate, wherein:

the at least one detection element is connected in parallel with a preset conduction path and the preset conduction path is disposed between the second signal connection terminal of the array substrate and the at least one display pixel;

when an aging process is performed on the plurality of display pixels, a first driving signal is applied on the at least one detection element and the at least one detection element changes from a first state to a second state, wherein the second state is different from the first state; and the second state of the at least one detection element indicates that the plurality of display pixels has undergone the aging process;

the method comprising:

providing a second driving signal to the at least one detection element;

determining that the plurality of display pixels has not undergone the aging process when the at least one detection element is in the first state; and determining that the plurality of display pixels has undergone the aging process when the at least one detection element is in the second state.

20. The method according to claim 19, wherein:

when a voltage is applied between a first terminal and a second terminal of the at least one detection element, the first state of the at least one detection element is a conduction state and the second state of the at least one detection element is a disconnection state;

the first terminal of the at least one detection element is connected to the first signal connection terminal of the array substrate, and the second terminal of the at least one detection element is connected to at least one display pixel of the plurality of display pixels;

a terminal of the preset conduction path is connected to the second signal connection terminal of the array substrate; and another terminal of the preset conduction path is connected to the at least one display pixel; and the method further includes:

providing the second driving signal to the at least one detection element; and determining the state of the at least one detection element based on a display state of the at least one display pixel, wherein:

it is determined that the at least one detection element is in the first state when the at least one display pixel is in a third state, and that the at least one detection element is in the second state when the at least one display pixel is in a fourth state;

the fourth state is different from the third state; and the third state is an off state and the fourth state is a lighted state.

21. The method according to claim 19, wherein:

when a voltage is applied between a first terminal and a second terminal of the at least one detection element, the first state of the at least one detection element is a disconnection state and the second state of the at least one detection element is a conduction state;

the at least one detection element is connected in series with at least one display pixel of the plurality of display pixels;

a terminal of the at least one detection element is connected to a second signal connection terminal of the array substrate;

another terminal of the at least one detection element is connected to the at least one display pixel; and the method further includes:

providing the second driving signal to the at least one detection element; and determining the state of the at least one detection element based on a display state of the at least one display pixel, wherein:

if the at least one display pixel is in a fourth state, the at least one detection element is in the second state and the plurality of display pixels has undergone the aging process and if the at least one display pixel is in a third state, the at least one detection element is in the first state and the plurality of display pixels has not undergone the aging process, the third state being different than the fourth state; and under a same driving signal, a brightness of the at least one display pixel in the third state is larger than a brightness of the at least one display pixel in the fourth state.

22. The method according to claim 19, wherein:

the at least one detection element is a unidirectional conduction diode and is connected in series with a crack detection line of the array substrate; and the method further includes:

providing the second driving signal to the at least one detection element; and determining the state of the at least one detection element based on a conduction state of the crack detection line, wherein:

when the crack detection line is in a unidirectional conduction state, it is determined that the at least one detection element is in the first state; and when the crack detection line is in a dual directional conduction state, it is determined that the at least one detection element is in the second state.

* * * * *